United States Patent
Sato et al.

(10) Patent No.: US 9,514,259 B2
(45) Date of Patent: Dec. 6, 2016

(54) LOGIC CONFIGURATION METHOD FOR RECONFIGURABLE SEMICONDUCTOR DEVICE

(71) Applicant: TAIYO YUDEN CO., LTD., Tokyo (JP)

(72) Inventors: Masayuki Sato, Tokyo (JP); Isao Shimizu, Gunma (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 44 days.

(21) Appl. No.: 14/443,635

(22) PCT Filed: Nov. 19, 2013

(86) PCT No.: PCT/JP2013/081087
§ 371 (c)(1),
(2) Date: May 18, 2015

(87) PCT Pub. No.: WO2014/080872
PCT Pub. Date: May 30, 2014

(65) Prior Publication Data
US 2015/0286762 A1    Oct. 8, 2015

(30) Foreign Application Priority Data

Nov. 20, 2012  (JP) .................. 2012-253780
Jun. 4, 2013   (JP) .................. 2013-117418

(51) Int. Cl.
*G06F 17/50*    (2006.01)
*H03K 19/177*   (2006.01)
*H03K 19/173*   (2006.01)

(52) U.S. Cl.
CPC ......... *G06F 17/5054* (2013.01); *G06F 17/505* (2013.01); *G06F 17/5077* (2013.01);
(Continued)

(58) Field of Classification Search
None
See application file for complete search history.

(56) References Cited

U.S. PATENT DOCUMENTS

| 6,150,838 A | 11/2000 | Wittig et al. |
| 6,208,163 B1 | 3/2001 | Wittig et al. |

(Continued)

FOREIGN PATENT DOCUMENTS

| JP | 2002-538652 A | 11/2002 |
| JP | 2004-246402 A | 9/2004 |

(Continued)

OTHER PUBLICATIONS

International Search Report (ISR) issued in PCT/JP2013/081087 mailed in May 2014.

(Continued)

*Primary Examiner* — Leigh Garbowski
(74) *Attorney, Agent, or Firm* — Chen Yoshimura LLP

(57) ABSTRACT

Provided is a logic configuration method for a semiconductor device having a plurality of memory units provided with a plurality of memory cells; each memory unit is configured to store truth table data in the memory cells thereof, the truth table data being for outputting a logic value in response to an address input, and to operate as a logic circuit; the memory units have n (where n is 2 or a higher integer) times two pairs of an input line and an output line; the n times two output lines from one memory unit among the memory units are connected to the n input lines of two other memory units; and the logic configuration method generates, on the basis of the circuit description describing the circuit configuration, a netlist having circuit connection information, extracts a logic cone from the netlist, and generates truth table data for the plurality of memory units, which constitute the logic cone, in the memory unit stage number corresponding to the (Continued)

number obtained by dividing the number of input lines to the logic cone by n/2.

33 Claims, 23 Drawing Sheets

(52) U.S. Cl.
CPC ..... *H03K 19/173* (2013.01); *H03K 19/17728* (2013.01); *H03K 19/17736* (2013.01); *H03K 19/17748* (2013.01)

(56) References Cited

U.S. PATENT DOCUMENTS

| | | | | |
|---|---|---|---|---|
| 6,629,296 | B1* | 9/2003 | Ganesan | G06F 17/5022 716/106 |
| 7,146,582 | B2* | 12/2006 | Kimura | G06F 17/505 716/103 |
| 7,509,618 | B1* | 3/2009 | Hutton | G06F 17/5027 716/104 |
| 7,652,946 | B2* | 1/2010 | Satoh | H03K 19/1776 365/189.011 |
| 8,283,945 | B2* | 10/2012 | Hironaka | H03K 19/17728 326/38 |
| 8,953,721 | B2* | 2/2015 | Nagahara | G01S 19/30 375/343 |
| 2004/0237055 | A1 | 11/2004 | Kimura et al. | |
| 2009/0154282 | A1 | 6/2009 | Satoh | |
| 2009/0290444 | A1 | 11/2009 | Satoh | |
| 2012/0007635 | A1 | 1/2012 | Hironaka et al. | |
| 2013/0100750 | A1 | 4/2013 | Ishiguro et al. | |

FOREIGN PATENT DOCUMENTS

| | | |
|---|---|---|
| JP | 2010-239325 A | 10/2010 |
| WO | 00/51239 A1 | 8/2000 |
| WO | 2007/060738 A1 | 5/2007 |
| WO | 2007/060763 A1 | 5/2007 |
| WO | 2011/162116 A1 | 12/2011 |

OTHER PUBLICATIONS

Written Opinion (PCT/ISA/237) issued in PCT/JP2013/081087 mailed in May 2014.

* cited by examiner

940A →

940B →

940C →

CMOS NAND gate

FIG. 30
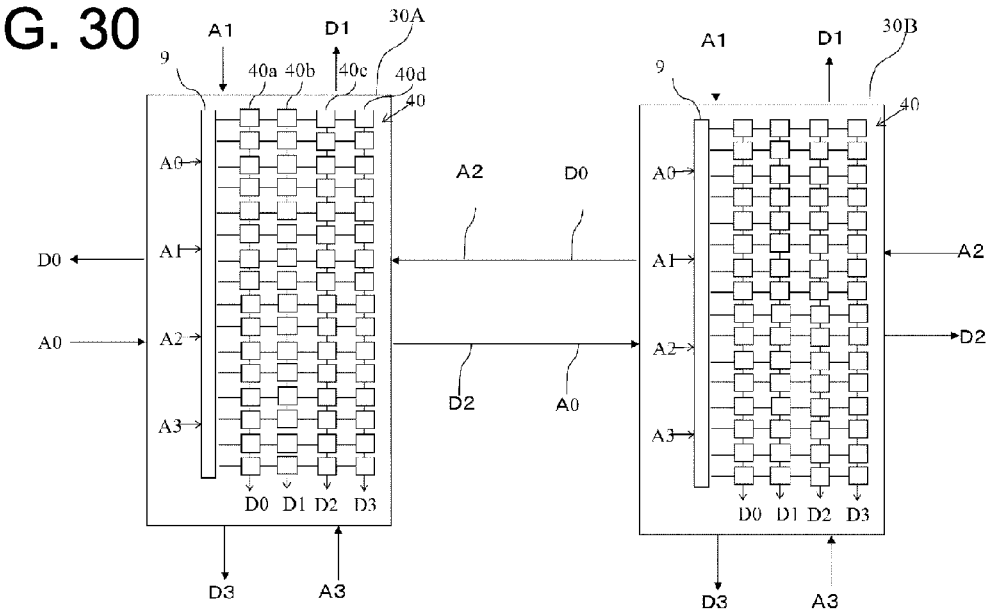
FIG. 31
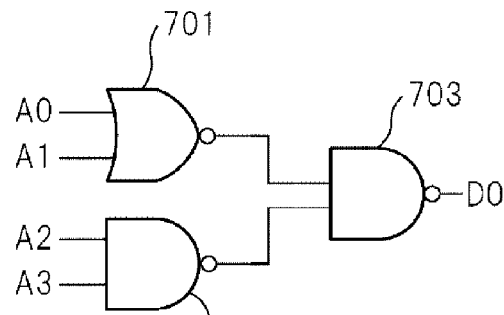
FIG. 32
| A0 | A1 | A2 | A3 | D0 | D1 | D2 | D3 |
|----|----|----|----|----|----|----|----|
| 0  | 0  | 0  | 0  | 0  | *  | ×  | ×  |
| 1  | 0  | 0  | 0  | 1  | *  | ×  | ×  |
| 0  | 1  | 0  | 0  | 1  | *  | ×  | ×  |
| 1  | 1  | 0  | 0  | 1  | *  | ×  | ×  |
| 0  | 0  | 1  | 0  | 0  | *  | ×  | ×  |
| 1  | 0  | 1  | 0  | 1  | *  | ×  | ×  |
| 0  | 1  | 1  | 0  | 1  | *  | ×  | ×  |
| 1  | 1  | 1  | 0  | 1  | *  | ×  | ×  |
| 0  | 0  | 0  | 1  | 0  | *  | ×  | ×  |
| 1  | 0  | 0  | 1  | 1  | *  | ×  | ×  |
| 0  | 1  | 0  | 1  | 1  | *  | ×  | ×  |
| 1  | 1  | 0  | 1  | 1  | *  | ×  | ×  |
| 0  | 0  | 1  | 1  | 1  | *  | ×  | ×  |
| 1  | 0  | 1  | 1  | 1  | *  | ×  | ×  |
| 0  | 1  | 1  | 1  | 1  | *  | ×  | ×  |
| 1  | 1  | 1  | 1  | 1  | *  | ×  | ×  |

FIG. 33
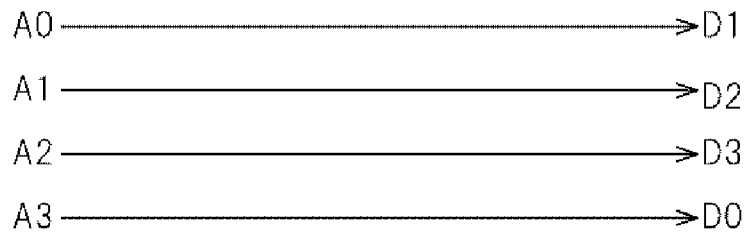
FIG. 34
| A0 | A1 | A2 | A3 | D0 | D1 | D2 | D3 |
|---|---|---|---|---|---|---|---|
| 0 | 0 | 0 | 0 | 0 | 0 | 0 | 0 |
| 1 | 0 | 0 | 0 | 0 | 1 | 0 | 0 |
| 0 | 1 | 0 | 0 | 0 | 0 | 1 | 0 |
| 1 | 1 | 0 | 0 | 0 | 1 | 1 | 0 |
| 0 | 0 | 1 | 0 | 0 | 0 | 0 | 1 |
| 1 | 0 | 1 | 0 | 0 | 1 | 0 | 1 |
| 0 | 1 | 1 | 0 | 0 | 0 | 1 | 1 |
| 1 | 1 | 1 | 0 | 0 | 1 | 1 | 1 |
| 0 | 0 | 0 | 1 | 1 | 0 | 0 | 0 |
| 1 | 0 | 0 | 1 | 1 | 1 | 0 | 0 |
| 0 | 1 | 0 | 1 | 1 | 0 | 1 | 0 |
| 1 | 1 | 0 | 1 | 1 | 1 | 1 | 0 |
| 0 | 0 | 1 | 1 | 1 | 0 | 0 | 1 |
| 1 | 0 | 1 | 1 | 1 | 1 | 0 | 1 |
| 0 | 1 | 1 | 1 | 1 | 0 | 1 | 1 |
| 1 | 1 | 1 | 1 | 1 | 1 | 1 | 1 |
FIG. 35
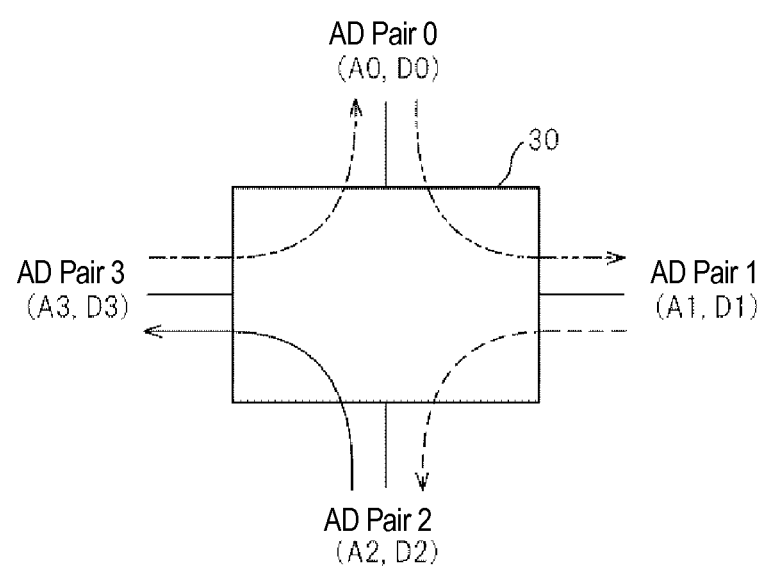

FIG. 36
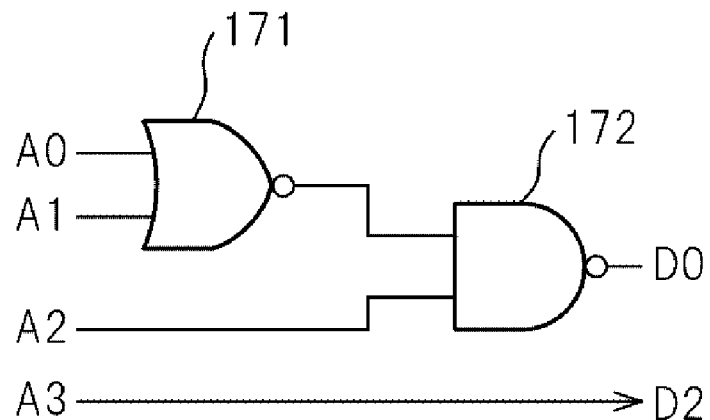
FIG. 37
| A0 | A1 | A2 | A3 | D0 | D1 | D2 | D3 |
|----|----|----|----|----|----|----|----|
| 0  | 0  | 0  | 0  | 0  | *  | 0  | *  |
| 1  | 0  | 0  | 0  | 0  | *  | 0  | *  |
| 0  | 1  | 0  | 0  | 0  | *  | 0  | *  |
| 1  | 1  | 0  | 0  | 1  | *  | 0  | *  |
| 0  | 0  | 1  | 0  | 0  | *  | 0  | *  |
| 1  | 0  | 1  | 0  | 0  | *  | 0  | *  |
| 0  | 1  | 1  | 0  | 0  | *  | 0  | *  |
| 1  | 1  | 1  | 0  | 0  | *  | 0  | *  |
| 0  | 0  | 0  | 1  | 0  | *  | 1  | *  |
| 1  | 0  | 0  | 1  | 0  | *  | 1  | *  |
| 0  | 1  | 0  | 1  | 0  | *  | 1  | *  |
| 1  | 1  | 0  | 1  | 1  | *  | 1  | *  |
| 0  | 0  | 1  | 1  | 0  | *  | 1  | *  |
| 1  | 0  | 1  | 1  | 0  | *  | 1  | *  |
| 0  | 1  | 1  | 1  | 0  | *  | 1  | *  |
| 1  | 1  | 1  | 1  | 0  | *  | 1  | *  |
FIG. 38
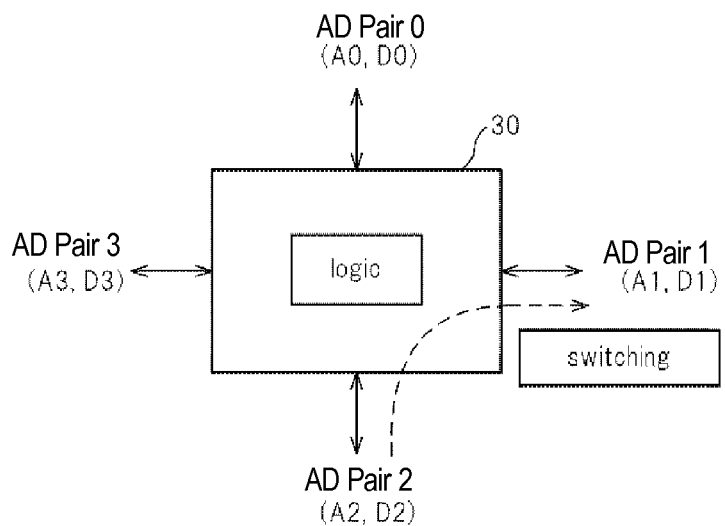

LOGIC CONFIGURATION METHOD FOR RECONFIGURABLE SEMICONDUCTOR DEVICE

TECHNICAL FIELD

The present invention relates to a logical configuration method of a reconfigurable semiconductor device, a program thereof, and a logic configuration device.

BACKGROUND ART

Reconfigurable (programmable or writable) semiconductor devices (also referred to as "reconfigurable devices") such as field-programmable gate arrays (FPGAs) are widely used due to their flexibility from being rewritable (Patent Document 1, for example).

Typical island-style FPGAs are constituted of logic element CLBs (configurable logic blocks), switching elements SB and CB, and input/output element IOBs.

Logic element CLBs are programmable elements that realize a combinational logic, and each CLB is constituted of a data flip-flop (DFF), a lookup table (LUT), or the like. LUTs having k inputs (k-LUTs) have $2^k$ SRAM (static random access memory) cells, and realize a function with k as the variable. There is a method, for example, in which a truth table of an appropriate logic function is stored in the SRAM, and output is performed on the basis of input with reference to the truth table.

In order to generate a signal path between CLBs to link the logic function portions, switching elements CB and SB, which can switch the signal path are disposed between the CLBs. The switching element CB is an element set between the logic block LB and a wiring channel, and the switching element SB is an element that performs settings between vertical and horizontal wiring lines in portions where the vertical and horizontal wiring lines intersect.

The input/output element IOB is a configuration element that functions as an interface between the input/output and the logic element LB of the device.

The applicant or inventor has developed "memory-based programmable logic devices (MPLD)" (registered trademark) in which a circuit configuration is constituted of memory cell units. MPLDs are disclosed in Patent Document 1 below, for example. In MPLDs, memory arrays referred to as "multi-look-up-tables" (MLUTs) are connected to each other. MLUTs store truth table data and form wiring elements and logic elements. MPLDs realize almost the same functions as FPGAs by having these MLUTs arranged in an array and connected to each other. Also, MPLDs are devices having flexibility for logic regions and wiring regions by using MLUTs both as logic elements and wiring elements by truth table data (Patent Document 2, for example), and differ from FPGAs having specialized switching circuits at the connections between memory cell units.

The optimal arrangement and wiring methods of FPGAs are already under consideration (Patent Document 3). In the case of MPLD logic configuration, the MLUTs operate as logic elements and/or connective elements, and thus, the writing of truth table data to the MLUTs signifies the arrangement of logic operations and/or the wiring between MLUTs. Thus, the generation of truth table data for writing to the MLUTs corresponds to the "arrangement/wiring" of the MPLDs.

The logic configuration of MPLDs is disclosed (Patent Document 4, FIG. 43). However, the disclosure is limited to a general configuration in which the number of input/output units of the MLUT is made to be less than the number of AD pairs (a pair including an address line and a data line, the pair connecting MLUTs to each other).

RELATED ART DOCUMENTS

Patent Documents

Patent Document 1: Japanese Translation of PCT International Application Publication No. 2002-538652
Patent Document 2: WO 2007/060763
Patent Document 3: Japanese Patent Application Laid-Open Publication No. 2010-239325
Patent Document 4: WO 2011/162116

SUMMARY OF THE INVENTION

Problems to be Solved by the Invention

As described above, there is no disclosure of the optimal arrangement and wiring method for FPGAs and MPLDs. MPLDs realize wiring elements and logic elements using the same type of MLUTs, and thus, by coming up with a good arrangement of logic cells when configuring a circuit, it is possible to reduce the number of MLUTs used as wiring elements. In other words, if an optimal arrangement/wiring has not been realized, the number of MLUTs increases, and thus, by an optimal arrangement/wiring, a small scale MPLD can realize desired functions. However, because MPLDs use MLUTs, which are memory cell units, as both the wiring elements and the logic elements, it is not possible to use the logic configuration tool algorithm of FPGAs in which logic and wiring are realized by different circuits. Because of this situation, a logic configuration method for MPLDs is necessary.

Means for Solving the Problems

Aspects to solve the above-mentioned problems are indicated in the following items:

1. A logic configuration method for a reconfigurable semiconductor device having a plurality of memory units each including a plurality of memory cells that store data,
   wherein the memory units are configured to operate as logic circuits by storing, in the memory cells therein, truth table data that outputs logic values in response to address input,
   wherein the memory units each have at least 2×n input lines and output lines forming pairs, n being an integer of greater than or equal to 2,
   wherein the memory units are connected to each other by 2×n output lines from one memory unit being connected to an n number of input lines of two other memory units, and
   wherein the logic configuration method includes:
   generating a netlist having circuit connective information on the basis of a circuit description that describes a circuit configuration to be implemented in the reconfigurable semiconductor device;
   extracting a logic cone that includes sequential logics from the netlist;
   determining the number of stages of memory units that are to be used to constitute the extracted logic cone on a basis of a quotient obtained by dividing a number of input lines to the extracted logic cone by n/2; and
   generating the truth table data for the memory units that constitute the extracted logic cone.

2. The logic configuration method according to item 1, wherein the step of generating the netlist includes typecasting variable bits in a program coded in a high level language to a smaller bit size.

3. The logic configuration method according to item 1 or 2, wherein the memory units are each connected to other memory units on one side and another side opposite to the one side, and have a plurality of memory cell units, wherein at least one of the plurality of memory cell units has a plurality of memory cells, and the memory cells store first truth table data for outputting a logic value from the one side and second truth table data for outputting a logic value from the another side in response to address input from the one side, and wherein the step of generating the truth table data includes generating the first truth table data and the second truth table data.

4. The logic configuration method according to any one of items 1 to 3, wherein the step of generating the netlist includes at least one of loop unrolling and parallelization in a program coded in a high level language.

5. The logic configuration method according to any one of items 1 to 4, further including:

extracting a scannable sequential logic data set from the netlist and generate a scanned sequential logic data set, generating a first truth table data set for writing to a first set among the plurality of memory cell units from the scanned sequential logic data set, and generating a second truth table data set for writing to a second set among the plurality of memory cell units from a combinational logic circuit data set of the netlist.

Typically, as shown in Patent Document 3, when arranging wiring lines, due to the structure of the logic circuit, expansion is performed at the gate level and the expanded gate elements are randomly arranged and the plurality of gate elements that have been arranged are connected. Then, due to gate expansion, the number of logic element CLBs is reduced by repeated optimization in which the number of CLBs in use and the operation speed are operating variables.

In a logic circuit simulation, a method is used in which the connection information such as a netlist of nodes between devices is not displayed, but instead, connection information using terminal names is displayed. In the logic configuration method of the present embodiment, wiring is not arranged by connection based on terminals, but rather, wiring is arranged by storing connection information or the like of the logic circuit and the sequential logic as netlist information at the level of a device such as a logic element or an FF, thereby storing data of correspondences between terminal names and nodes, allowing post-conversion confirmation to be performed with ease, and allowing simplification of the circuit and reconfiguration of the circuit block by the device to be performed with ease.

Aspects to solve the above-mentioned problems are indicated by the following items:

6. The logic configuration method according to any one of items 1 to 5, wherein the semiconductor device has, in addition to the memory units, a plurality of logic units each having a sequential logic element, and wherein the logic configuration method further includes:
generating the netlist describing logic circuit data, sequential logic data, and connective information of the logic circuit data and the sequential logic data from the circuit description describing the circuit configuration; and allocating the logic circuit data and the sequential logic data respectively to the memory cells and the logic circuit elements from the generated netlist according to the connective information.

In this manner, it is possible to simplify the circuit or reconfigure the circuit block by the device by wiring arrangement at the level of the device level from the connective information and the like of the logic circuit and the sequential logic and not by terminal-based connection.

7. The logic configuration method according to item 6, wherein the semiconductor device has switching elements on outer portions of the logic units, and wherein the logic configuration device further includes: allocating connective information of the netlist to the switching elements.

8. The logic configuration method according to item 6 or 7, wherein the memory cells of the memory units operate as connective elements when truth table data, configured to output to the memory units of other logic units an input value identified by an address, is written, and wherein the logic configuration method further includes: allocating connective information of the netlist to the memory units.

9. The logic configuration method according to any one of items 6 to 8, further including:

wherein the sequential logic data is removed after generating the netlist; and wherein the logic circuit data is allocated to the memory cells, and then the sequential logic data is allocated to the logic circuit elements from the generated netlist in accordance with the connective information.

10. The logic configuration method according to any one of items 6 to 9, wherein the step of generating the netlist includes generating logic circuit data, sequential logic data, and a parallel-in/serial-out shift register including the logic circuit data.

11. The logic configuration method according to any one of items 6 to 10, wherein the sequential logic elements store data read from the memory units and are sequential logics that output the stored data in synchronization with a clock signal.

12. A logic configuration device that performs logic configuration for a semiconductor device having a plurality of memory units each including a plurality of memory cells that store data, wherein the semiconductor device is configured such that the memory units operate as logic circuits by storing, in the memory cells therein, truth table data that outputs logic values in response to address input, wherein the memory units each have at least 2×n input lines and output lines forming pairs, n being an integer of greater than or equal to 2, wherein the memory units are connected to each other by 2×n output lines from one memory unit being connected to an n number of input lines of two other memory units, wherein the logic configuration device includes a processor, and wherein the processor is configured so as to
generate a netlist having circuit connective information on the basis of a circuit description that describes a circuit configuration to be implemented in the semiconductor device;
extract a logic cone that includes sequential logics from the netlist;
determine the number of stages of memory units that are to be used to constitute the extracted logic cone on a basis of a quotient obtained by diving a number of input lines to the extracted logic cone by n/2; and generate the truth table data for the memory units that constitute the extracted logic cone.

13. The logic configuration device according to item 12, wherein generation of the netlist includes typecasting variable bits in a program coded in a high level language to a smaller bit size.

14. The logic configuration device according to item 12 or 13, wherein the memory units are each connected to other memory units on one side and another side opposite to the one side, and have a plurality of memory cell units, wherein at least one of the plurality of memory cell units has a plurality of memory cells, and the memory cells store first truth table data for outputting a logic value from the one side and second truth table data for outputting a logic value from the another side in response to address input from the one side, and wherein the step of generating the truth table data includes generating the first truth table data and the second truth table data.

15. The logic configuration device according to any one of items 12 to 14, wherein the generation of the netlist includes at least one of loop unrolling and parallelization in a program coded in a high level language.

16. The logic configuration device according to any one of items 12 to 15, wherein the processor is configured so as to extract a scannable sequential logic data set from the netlist and generate a scanned sequential logic data set;

generate a first truth table data set for writing to a first set among the plurality of memory cell units from the scanned sequential logic data set; and generate a second truth table data set for writing to a second set among the plurality of memory cell units from a combinational logic circuit data set of the netlist.

17. The logic configuration device according to any one of items 12 to 16, wherein the semiconductor device has, in addition to the memory units, a plurality of logic units having sequential logic elements, wherein the processor generates the netlist describing logic circuit data, sequential logic data, and connective information of the logic circuit data and the sequential logic data from the circuit description describing the circuit configuration, and allocates the logic circuit data and the sequential logic data respectively to the memory cells and the logic circuit elements from the generated netlist according to the connective information.

18. The logic configuration device according to item 17, wherein the semiconductor device has switching elements on outer portions of the logic units, and wherein the logic configuration device further includes:
allocating connective information of the netlist to the switching elements.

19. The logic configuration device according to item 17 or 18, wherein the memory cells of the memory units operate as connective elements when truth table data, configured to output to the memory units of other logic units an input value identified by an address, is written, and wherein the processor is configured so as to allocate connective information of the netlist to the memory units.

20. The logic configuration device according to any one of items 17 to 19, wherein the processor is configured so as to remove the sequential logic data after generating the netlist; and allocate the logic circuit data to the memory cells, and then allocate the sequential logic data to the logic circuit elements from the generated netlist in accordance with the connective information.

21. The logic configuration device according to any one of items 17 to 20, wherein generating the netlist includes generating logic circuit data, sequential logic data, and a parallel-in/serial-out shift register including the logic circuit data.

22. The logic configuration device according to any one of items 17 to 21, wherein the sequential logic elements store data read from the memory units and are sequential logics that output the stored data in synchronization with a clock signal.

23. A non-transitory storage medium that stores a program executable by a processor, the program being for performing logic configuration for a semiconductor device having a plurality of memory units each including a plurality of memory cells that store data, wherein the semiconductor device is configured such that the memory units operate as logic circuits by storing, in the memory cells therein, truth table data that outputs logic values in response to address input, wherein the memory units each have at least 2×n input lines and output lines forming pairs, n being an integer of greater than or equal to 2, wherein the memory units are connected to each other by 2×n output lines from one memory unit being connected to an n number of input lines of two other memory units, and wherein the program causes the processor to perform the following:

generating a netlist having circuit connective information on the basis of a circuit description that describes a circuit configuration to be implemented in the reconfigurable semiconductor device;

extracting a logic cone that includes sequential logics from the netlist;

determining the number of stages of memory units that are to be used to constitute the extracted logic cone on a basis of a quotient obtained by dividing a number of input lines to the extracted logic cone by n/2; and generating the truth table data for the memory units that constitute the extracted logic cone.

24. The non-transitory storage medium according to item 23, wherein generation of the netlist includes typecasting variable bits in a program coded in a high level language to a smaller bit size.

25. The non-transitory storage medium according to item 23 or 24, wherein the memory units are each connected to other memory units on one side and another side opposite to the one side, and have a plurality of memory cell units, wherein at least one of the plurality of memory cell units has a plurality of memory cells, and the memory cells store first truth table data for outputting a logic value from the one side and second truth table data for outputting a logic value from the another side in response to address input from the one side, and wherein the process of generating the truth table data includes a process of generating the first truth table data and the second truth table data.

26. The non-transitory storage medium according to any one of items 23 to 25, wherein the generation of the netlist includes at least one of loop unrolling and parallelization in a program coded in a high level language.

27. The non-transitory storage medium according to any one of items 23 to 26, wherein the program causes the processor perform the following:

extracting a scannable sequential logic data set from the netlist and generating a scanned sequential logic data set;

generating a first truth table data set for writing to a first set among the plurality of memory cell units from the scanned sequential logic data set; and generating a second truth table data for writing to a second set among the plurality of memory cell units from a combinational logic circuit data set of the netlist.

28. The non-transitory storage medium according to any one of items 23 to 27, wherein the semiconductor device has, in addition to the memory units, a plurality of logic units having sequential logic elements, wherein the program causes the processor to perform the following:

generating the netlist describing logic circuit data, sequential logic data, and connective information of the logic circuit data and the sequential logic data from the circuit description describing the circuit configuration; and allocating the logic circuit data and the sequential logic data respectively to the memory cells and the logic circuit elements from the generated netlist in accordance with the connective information.

29. The non-transitory storage medium according to item 28, wherein the semiconductor device has switching elements on outer portions of the logic units, and wherein the program causes the processor to execute a process of allocating connective information of the netlist to the switching elements.

30. The non-transitory storage medium according to item 28 or 29, wherein the memory cells of the memory units operate as connective elements when truth table data, configured to output to the memory units of other logic units an input value identified by an address, is written, and wherein the processor executes a process of allocating connective information of the netlist to the memory units.

31. The non-transitory storage medium according to any one of items 28 to 30, wherein the program causes the processor to perform the following:

removing the sequential logic data after generating the netlist, and allocating the logic circuit data to the memory cells, and then allocating the sequential logic data to the logic circuit elements from the generated netlist in accordance with the connective information.

32. The non-transitory storage medium according to any one of items 28 to 31, wherein generation of the netlist includes a process of generating logic circuit data, sequential logic data, and a parallel-in/serial-out shift register including the logic circuit data.

33. The non-transitory storage medium according to any one of items 23 to 32, wherein the sequential logic elements store data read from the memory units and are sequential logics that output the stored data in synchronization with a clock signal.

Effects of the Invention

In the logic configuration method according to the present embodiment, by reducing the number of memory cell units used in wiring logic in a reconfigurable semiconductor device constituted of memory cell units, it is possible to increase wiring arrangement efficiency.

Also, in the logic configuration method of the present embodiment, by arranging wiring at the device level of the connective information of the logic circuit and the sequential logic, or the like, instead of arranging wiring by connection based on the terminals, it is possible to simplify the circuit and reconfigure the circuit block by the device with ease.

BRIEF DESCRIPTION OF THE DRAWINGS

FIG. 30 shows an example of an MLUT operating as a logic element.

FIG. 31 shows an example of an MLUT operating as a logic circuit.

FIG. 32 shows a truth table of the logic circuit shown in FIG. 31.

FIG. 33 shows an example of an MLUT operating as a connective element.

FIG. 34 shows a truth table of the connective element shown in FIG. 33.

FIG. 35 shows an example of a connective element realized by an MLUT having four AD pairs.

FIG. 36 shows an example of one MLUT operating as a logic element and a connective element.

FIG. 37 shows a truth table of the logic element and the connective element shown in FIG. 36.

FIG. 38 shows an example of a logic operation and a connective element realized by an MLUT having AD pairs.

DETAILED DESCRIPTION OF EMBODIMENTS

Below, (1) a configuration of an MRLD, (2) multidirectional-type MLUTs, (3) bidirectional-type MLUTs, (4) a logic configuration method, and (5) an example of a truth table that causes the MLUT to operate as a logic element and/or a connective element will be described in that order with reference to drawings.

(1) Configuration of MRLD

Figure 1:
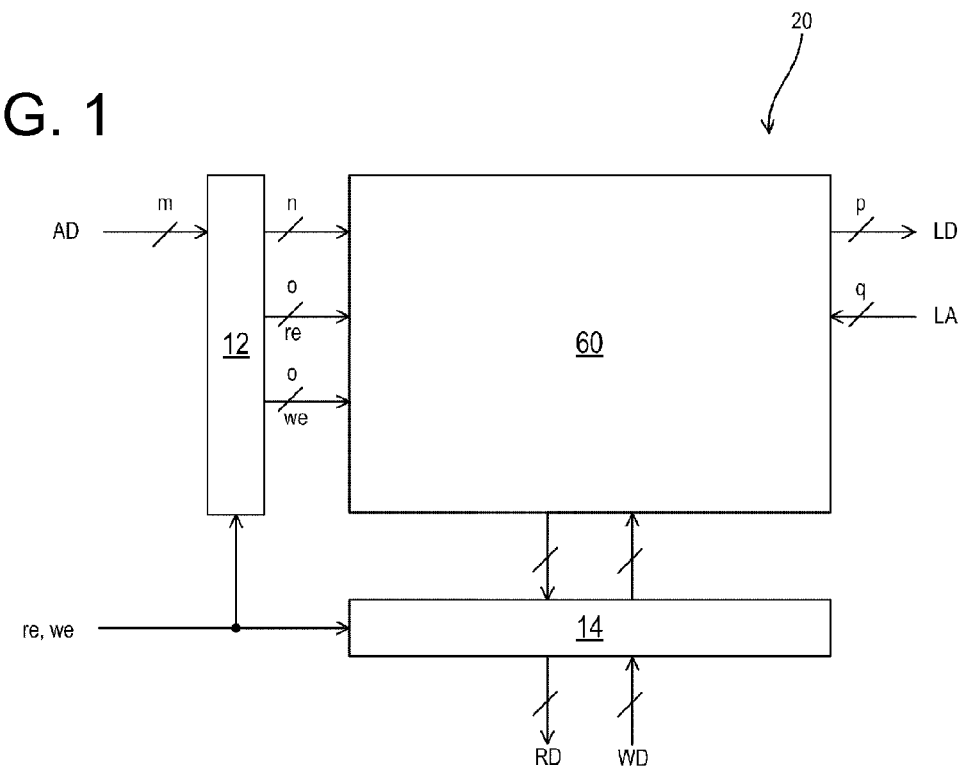
FIG. 1 shows a configuration example of MLUTs being connected to each other by one address line or data line.

FIG. 1 shows an example of an overall configuration of a reconfigurable semiconductor device of the present embodiment. Below, the reconfigurable logic device will be referred to as an MRLD (memory-based reconfigurable logic device; registered trademark). MRLDs have a similar function to FPGAs, but the structures thereof differ from each other. FPGAs are constituted of LUTs, switch blocks, connection blocks, and the like, and the ratio of logic resources and wiring resources is fixed. By contrast, MRLDs have a configuration in which the logic elements and the wiring elements known as MLUTs are both arranged as usable elements. By this configuration, it is possible to increase the proportion of the total area taken up by the logic region.

Below, an MRLD will be described as an example of a reconfigurable semiconductor device, but the logic configuration method of the present embodiment is not limited to MRLDs and may also be adopted to FPGAs. In such a case, if the MLUT (described later) as a logic unit having a memory unit having a plurality of memory cells and a sequential logic element operates as a logic element, then the logic element is a CLB, and if the MLUT operates as a wiring element, then it corresponds to the switching elements SB and CB.

In FIG. 1, "20" indicates the MRLD as the reconfigurable semiconductor device. The MRLD 20 has a logic unit array 60 in which logic units to be mentioned later are arranged in an array, a decoder 12 for identifying an address for reading from or writing to a memory unit of the logic unit, and an input/output unit 14 that inputs/outputs writing data WD or reading data RD.

The logic unit array 60 has MLUTs arranged in an array. Data considered truth tables are respectively stored in the memory cells of the memory unit, and by outputting a logic value (either "0" or "1"; the result of a logic calculation such as negation, logical disjunction, logical conjunction, and exclusive disjunction) based on an address input, the logic unit performs a logic operation as a logic element, a connective element, or both a logic element and a connective element. An example of the logic unit operating as the logic element and/or the connective element is described in (5), and a configuration example of the memory element will be described later with reference to FIG. 3B.

The logic operation of the MRLD 20 relies on a logic operation address LA and logic operation data LD depicted with solid lines. The logic operation address LA is used as the input signal of the logic circuit. The logic operation data LD is used as the output signal of the logic circuit. The logic operation address LA to the logic unit is connected to the data line of the logic operation data LD to the adjacent logic unit.

The logic resulting from the logic operation of the MRLD 20 is realized by truth table data stored in the memory unit. A number of logic units operate as logic elements as combined circuits including AND circuits, adders, and the like. Other logic units can operate as connective elements connecting the logic units that are combined circuits. The rewriting of the truth table data for the logic units to be logic elements and connective elements is performed by writing data to the memory. Examples of logic elements and connective elements realized by the truth table data are described later with reference to FIGS. 30 to 38.

The writing operation of the MRLD 20 is performed by the writing address AD and the writing data WD, and the reading operation is performed by the writing address AD and the reading data RD.

The writing address AD is an address to specify the memory cell in the memory unit. The writing address AD specifies an nth memory cell using an m number of signal lines, n being equal to $2^m$. The writing address AD is used both for reading from and writing to memory, and the writing address AD is decoded by the decoder 12 through the m number of signal lines to select the target memory cell. In the present embodiment, decoding of the logic operation address LA, which will be described later, is performed by a decoder in the memory unit.

The decoder 12 decodes the writing address AD in accordance with control signals such as a read enable signal re and a write enable signal we, and the decoded address n is outputted to the MLUT 30. The decoded address n is used as an address to specify the memory cell in the memory unit.

The input/output unit 14 writes writing data WD according to the write enable signal we and outputs reading data RD according to the read enable signal re.

Figure 2:
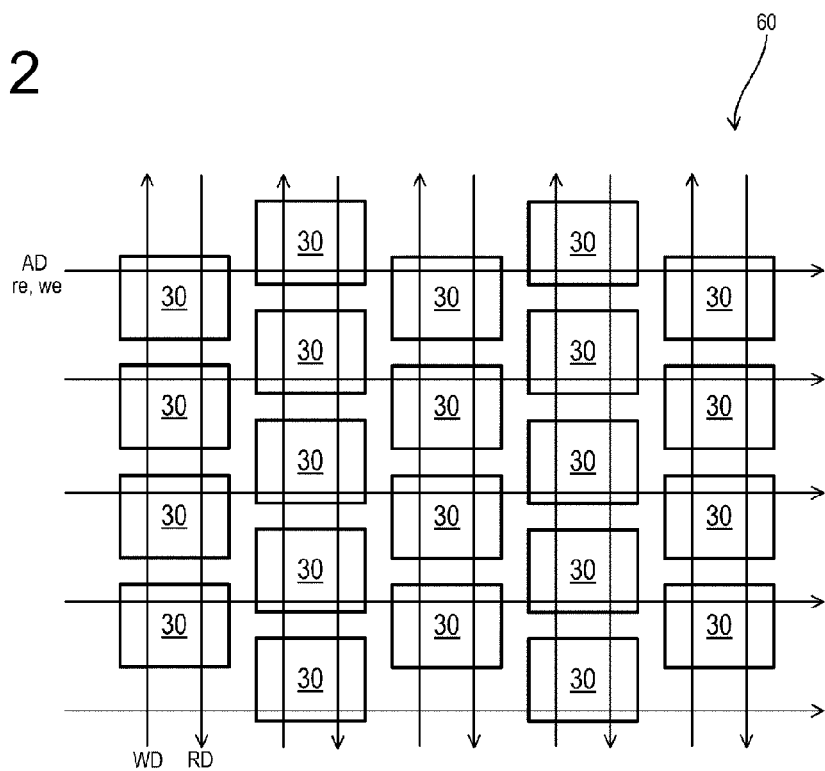
FIG. 2 shows an example of logic unit array.
Figure 3A:
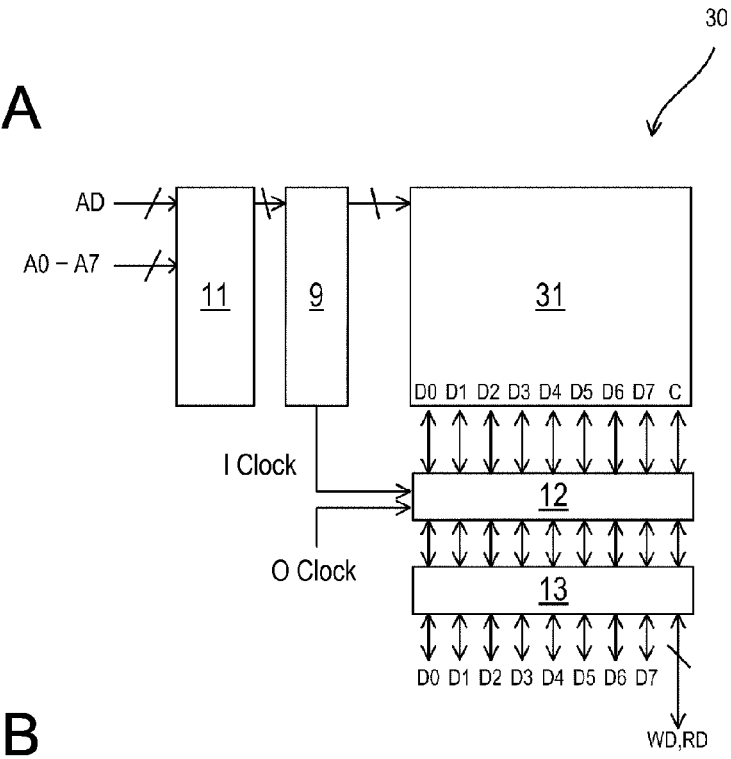
FIG. 3A shows an example of a circuit of an MLUT.

FIG. 2 shows an example of logic unit array. In FIG. 2 the connections by the address lines and the data lines connecting the logic units 30 are not shown in detail; the address lines and the data lines will be described using FIG. 3 and the like below. As shown, the logic unit array 30 has MLUTs 30 arranged in an array. Each MLUT is connected to respective signal lines for the writing address AD, the write enable signal we, the read enable signal re, the writing data WD, and the reading data RD.

(1.1) MLUT

FIG. 3 shows an example of a circuit of an MLUT. The MLUT 30 shown in FIG. 3 has a memory cell unit 31, an address decoder 9, an address selector 11, an input/output (I/O) buffer 12, and a data selector 13.

The memory cell unit 31 has n×2$^n$ memory cells that store data. The memory cells are disposed in connecting portions between 2$^n$ word lines and n bit lines. The number of bit lines may be increased to greater than n according to need. After outputting from the memory cell unit, the "bit lines" are referred to as "data lines." In the present example, the term "bit line" is used in the description of the memory element. Details of the memory cell will be described later with reference to FIG. 3B.

The address decoder 9 decodes inputted address signals A0 to A7 and outputs decoded signals (also referred to as "word line selection signals") to the word lines. The decoded signals have a signal level of "H," and word lines through which no decoded signal flows are at a signal level of "L (low)." The address decoder 9 is configured so as to output a decoded signal at a signal level "H" to one word line among the 2$^n$ word lines. The memory cell selected by the decoded signal flowing through the word line outputs stored data to the bit line.

The address selector 11 selects writing addresses AD and logic addresses A0 to A7. This example shows a single port memory cell (FIG. 3B) that performs only one of a writing operation and a logic operation. If a dual port memory is to be used, then reading from and writing to a memory cell can be performed simultaneously, which obviates the need for the address selector 11.

The I/O buffer 12 provides an FF (flip-flop) function as a sequential logic element by reading data from data lines of the memory cell unit in synchronization with either an external clock signal (OClock) or an internal clock (IClock). As for the external clock signal (OClock) and the internal clock signal (IClock), by shortening the period of the internal clock signal, it is possible to speed up operations in synchronization with the internal clock signal, or the like. In order to switch between the external clock signal and the internal clock signal, a one bit array that stores data for controlling the clock signals is provided in the memory cell unit 31, and with the truth table data, this bit array can be rewritten from an external source.

The data selector 13 is a selection circuit that switches between reading data RD and writing data WD.

(1.2) Memory Cell

Figure 3B:
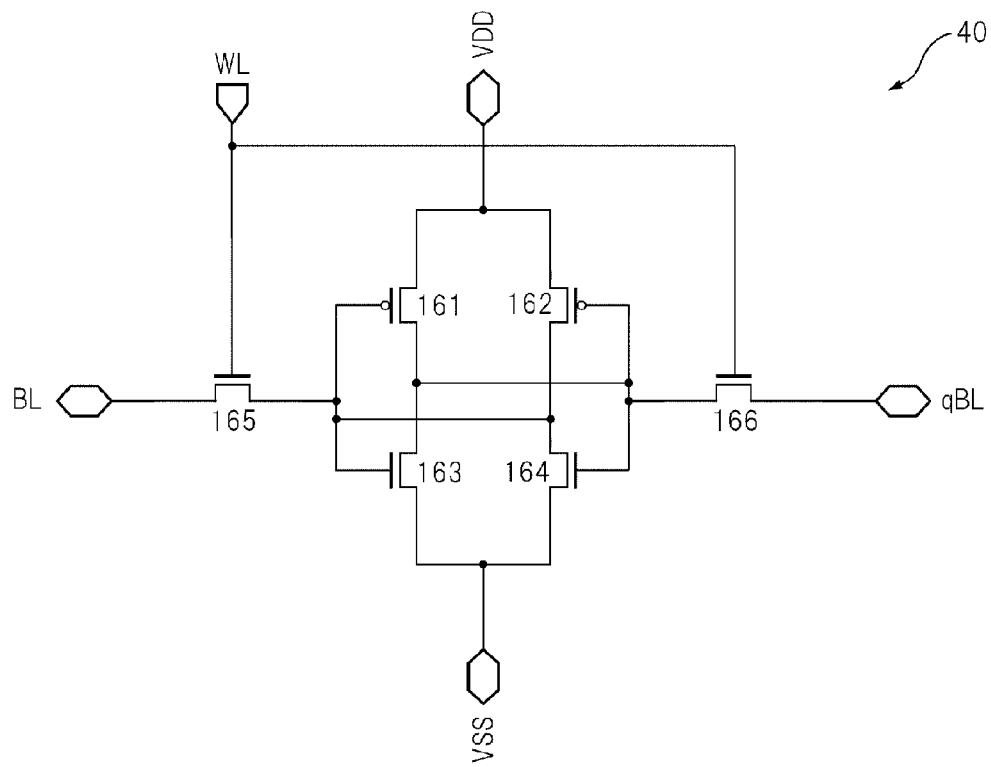
FIG. 3B shows an example of a single port memory cell.

FIG. 3B shows an example of a single port memory cell. The memory cells (also referred to as "memory elements") are disposed at respective intersections between word lines, which are signal lines for the decoding signals, and bit lines. A memory element 40 shown in FIG. 3B is provided with pMOS (metal oxide semiconductor) transistors 161 and 162, and nMOS transistors 163, 164, 165, and 166. The source of the pMOS transistor 161 and the source of the pMOS transistor 162 are connected to a VDD (power source voltage terminal). The drain of the nMOS transistor 163 and the drain of the nMOS transistor 164 are connected to a VSS (ground voltage terminal).

The drain of the nMOS transistor 165 is connected to a bit line BL. The gate of the nMOS transistor 165 is connected to the word line WL. The drain of the nMOS transistor 166 is connected to a bit line qBL. The gate of the nMOS transistor 166 is connected to the word line WL.

According to the configuration above, during the writing operation, the memory element 40 stores the signal level transmitted from the bit line BL and the bit line qBL in the pMOS transistors 161 and 162 and the nMOS transistors 163 and 164 by the signal level "H (high)" in the word line WL. During the reading operation, the memory element 40 transmits the signal level stored in the pMOS transistors 161 and 162 and the nMOS transistors 163 and 164 to the bit line BL and the bit line qBL by the signal level "H" of the word line WL.

(1.3) 2-Memory Cell Unit-Type MLUT

Figure 4:
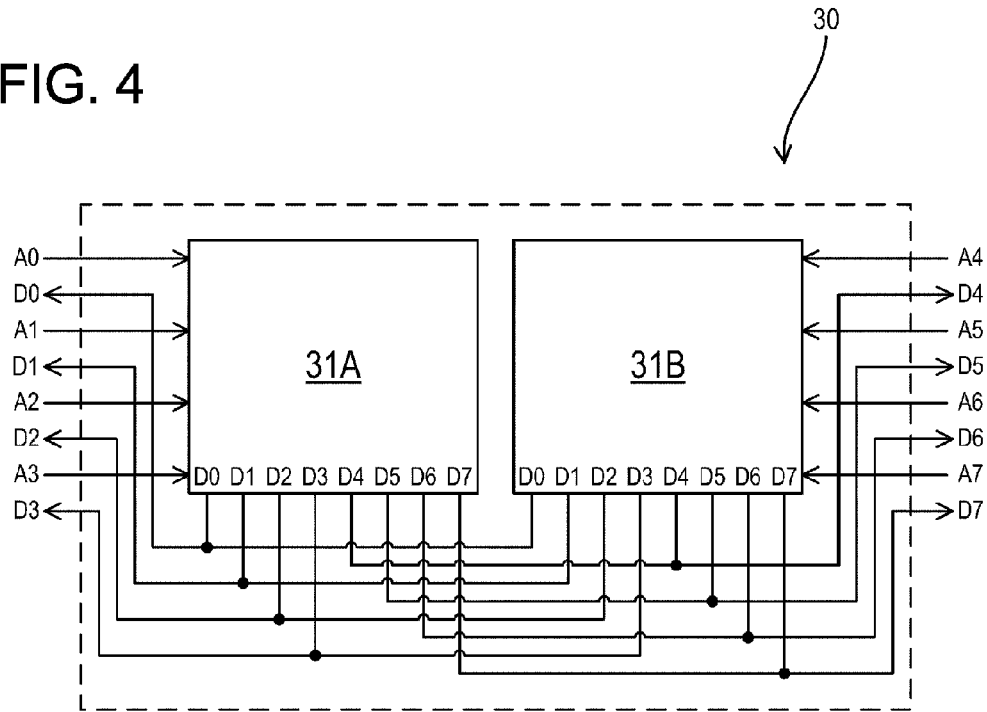
FIG. 4 shows an example of a two-memory cell unit MLUT.

FIG. 4 shows an example of a two-memory cell unit MLUT. The MLUT 30 shown in FIG. 4 is rectangular, and is a bidirectional-type MLUT limited to address line or data line connection in two directions as described later. The MLUT is connected to other memory units through a plurality of address lines or a plurality of data lines on one side, and is connected to other memory units through a plurality of address lines or a plurality of data lines on the other side opposite to the one side, and has a plurality of memory cell units 31A and 31B.

Each of the memory cell units 31A and 31B stores truth table data in order to output to the data line logic calculations stored in a memory cell specified by a certain address line and operates as a logic circuit, and/or stores truth table data in order to output to the data line connected to the address line of another MLUT a value stored in a memory cell specified by a certain address line and operates as a connecting circuit.

As shown in FIG. 4, the AD pairs input or output to two directions on the left and right of the MLUT 30. The plurality of memory cells having memory cell units 31A and 31B store first truth table data outputted to a first plurality of data lines on one side and second truth table data outputted to a second plurality of data lines on the other side by being selected by the decoded signal of the address inputted from one side.

The memory cell unit 31A outputs the output data D0 to D7 of the address signals A0 to A3 inputted from the left (one side) to the left output ends D0 to D3 (corresponding to the "first plurality of data lines"), and to the output ends D4 to D7 (corresponding to the "second plurality of data lines") to the side of the other memory cell unit 31B (other side). The connective configuration for causing the outputted signal to return to the signal input direction as in the output ends D0 to D3 will be referred to below as "feedback."

The memory cells for the output ends D0 to D3 of the memory cell unit 31A store the return direction truth table data (first truth table data), and the memory cells for the output data D0 to D7 store the right to left direction truth table data (second truth table data). The memory cell units 31B similarly output the output data D0 to D7 for the inputted address signals A4 to A7, to the output ends D4 to D7 for the input unit side, and to the output ends D0 to D3 to the other memory cell units.

The connecting portions for the output signals of both memory cell units constitute a wired-OR, or are connected by an OR circuit, and thus, prescribed data can be transmitted.

The MLUT 30 is a bidirectional-type MLUT, and thus, as a general rule uses the address lines A0 to A3 for the outward direction (left to right direction) and the address lines A4 to A7 for the return direction (right to left direction). The truth table data used for the outward direction and the truth table data used for the return direction are respectively prepared.

If return direction processing is not to be performed, then the truth table data is set such that D0 to D3 in the memory cell unit 31A and D4 to D7 of the memory cell unit 31B are set at "0." If return direction processing is to be performed, then the truth table data is set such that D4 to D7 in the memory cell unit 31A and D0 to D3 of the memory cell unit B31 are set at "0."

In FIG. 4, the two memory cell units 31A and 31B have data connection towards one direction and data connection in the return direction, but one of the memory cell units may have a reduced number of memory cells by removing some data connection in the return direction. In such a case, the one memory cell unit has data flow both to the left and right, and the other memory cell unit has data flow only to the left.

Figure 5:
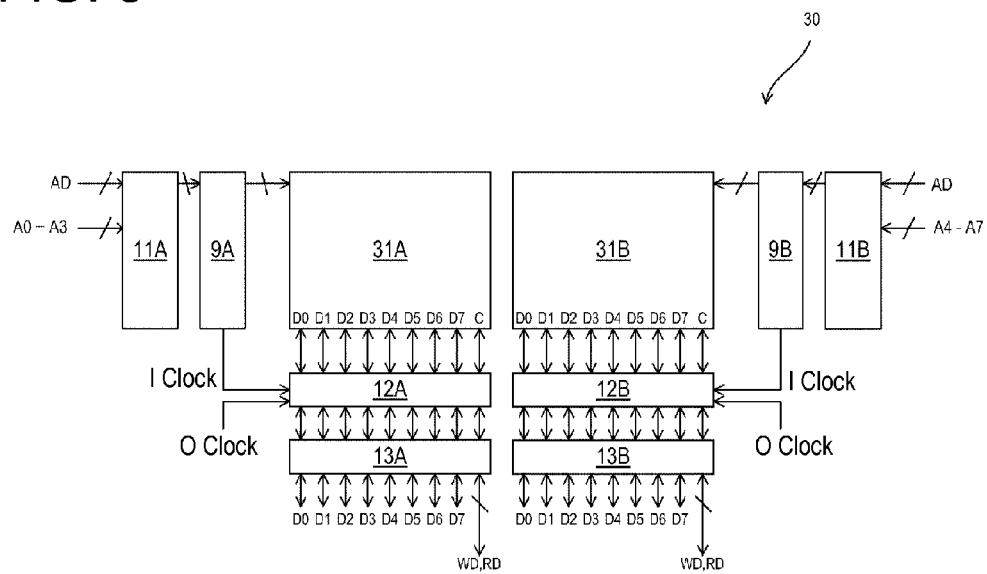
FIG. 5 shows an example of a circuit of an MLUT.

FIG. 5 shows an example of a circuit of an MLUT. The MLUT 30 shown in FIG. 5 has memory cell units 31A and 31B, address decoders 9A and 9B, address selectors 11A and 11B, input/output (I/O) buffers 12A and 12B, and data selectors 13A and 13B. The memory cell units 31A and 31B respectively have address decoders, address selectors, I/O buffers, and data selectors.

The memory cell units 31A and 31B store truth table data for connecting to the left and to the right (return direction). The address decoder 9A decodes addresses A0 to A3 inputted from the left. The address decoder 9B decodes addresses A4 to A7 inputted from the right.

The address selectors 11A and 11B select writing addresses AD and logic addresses A0 to A3 and A4 to A7. This example shows a single port memory cell (FIG. 3B) that performs only one of a writing operation and a logic operation. If a dual port memory is to be used, then reading from and writing to a memory cell can be performed simultaneously, which obviates the need for the address selectors 11A and 11B.

The I/O buffers 12A and 12B provide an FF function by reading data from data lines of the memory cell unit in synchronization with either an external clock signal (OClock) or an internal clock (IClock). As for the external clock signal (OClock) and the internal clock signal (IClock), by shortening the period of the internal clock signal, it is possible to speed up operations in synchronization with the internal clock signal, or the like. In order to switch between the external clock signal and the internal clock signal, a one bit array that stores data for controlling the clock signals is provided in the memory cell unit, and with the truth table data, this bit array can be rewritten from an external source. The I/O buffers 12A and 12B include sense amplifiers that amplify the voltages outputted from the bit lines of the memory cells.

The data selectors 13A and 13B are selection circuits that switch between reading data RD and writing data WD.

In this manner, the MRLD having the MLUTs performs data processes of a plurality of bits to adjacent MLUTs, and configure a memory unit with a plurality of memory cell units. The number of memory cell units increases in proportion to the square of the number of address lines, and thus, even if the number of data lines is the same, if the number of address lines in each memory cell unit is decreased, then it is possible to reduce the total number of memory cells needed.

(2) Multi-Directional Type MLUT

Figure 6:
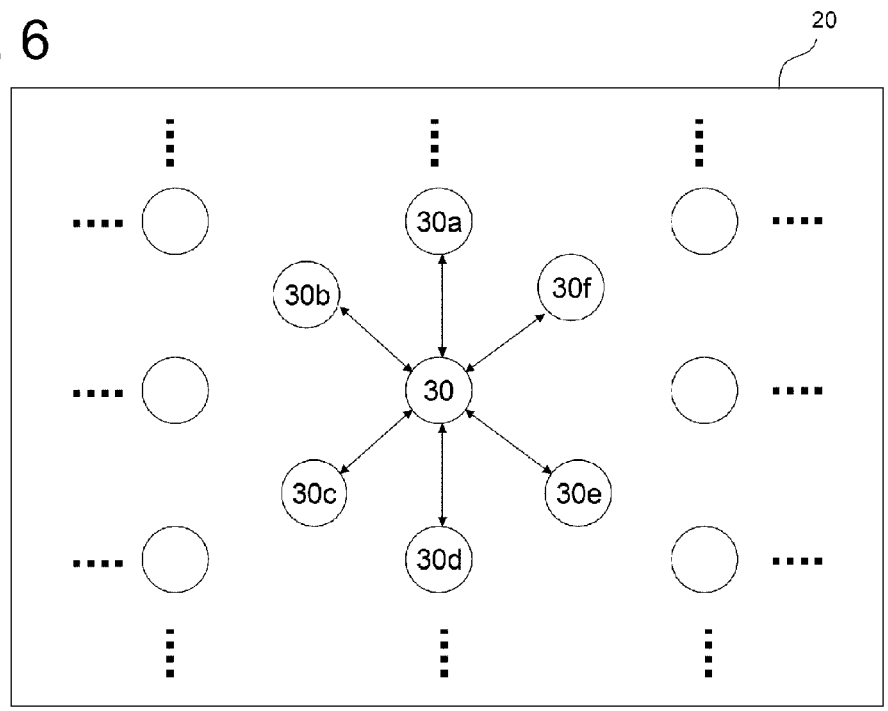
FIG. 6 shows a configuration example of MLUTs being connected to each other by one address line or data line.

FIG. 6 shows a configuration example of MLUTs being connected to each other by one address line or data line. The MRLD 20 shown in FIG. 6 shows MLUTs 30a to 30f configured such that the connection between adjacent MLUTs is achieved by one address or data line. In such a configuration, adjacent MLUTs are connected by one AD pair, and thus, data transmitted between adjacent MLUTs is 1 bit. MLUTs that are connected in this manner to adjacent MLUTs in multiple directions, and that have a transmission bit width of 1 bit are referred to as "multidirectional-type MLUTs." FIGS. 31A to 31D of Patent Document 4 disclose a configuration in which the number of MLUTs used is the fewest if an MRLD is achieved by a simple circuit configuration such as a "be_adder."

As shown in FIG. 6, the double-headed arrow represents an AD pair, and when a single-headed arrow is shown as in FIG. 4, this indicates either the address line or the data line.

Figure 7:
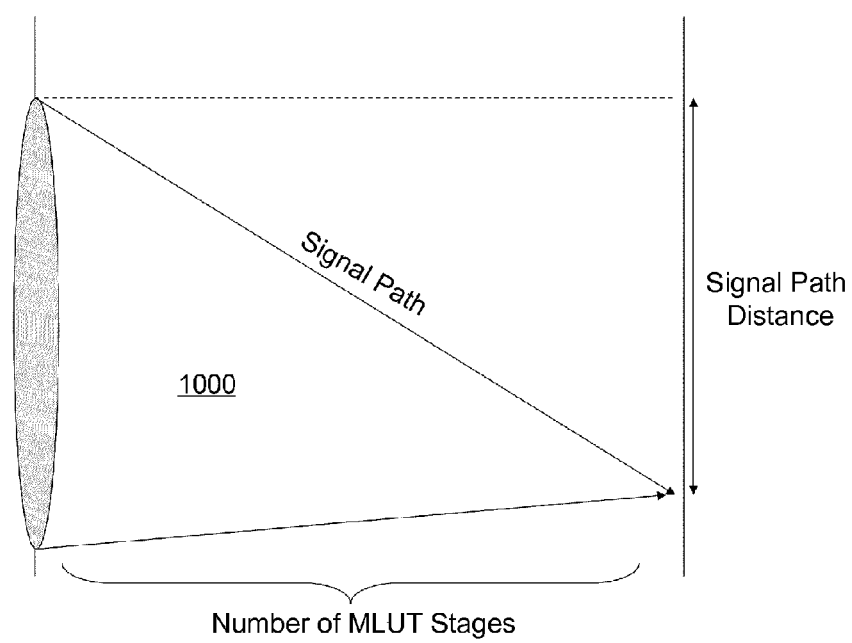
FIG. 7 shows an example of logic cone.

FIG. 7 is an example of a logic cone. Using this logic cone, a case in which usage of a multidirectional type MLUT would be difficult will be described. A logic cone refers to a group constituted of a combinational logic surrounded by registers formed of FFs or the like or by input/output units. The logic cone shown in FIG. 7 has a plurality of FF operating under one clock signal, although this is not shown, and a combinational logic circuit connects the output of an FF to the input of an FF. When performing synthesis using the C programming language, variables are expressed by flip-flops and arranged in the input/output ends, and the circuit data is generated between FFs. If a certain clock signal in an input terminal array 1010 enters the FF, then the values of all FFs are updated, and if the FF values are updated, then all combinational logics operate, and the range of effect spreads to the lower stage circuits until the next clock signal arrives, thereby determining the input of an FF at the output terminal array 1020. In this manner, a logic cone 1000, which is a group defined by all input and logic circuit elements affecting one FF output, is formed. The number of MLUT stages shown in FIG. 7 will be described later.

(2.1) Problem of Multi-Directional MLUTs; Increasing Number of MLUTs Used for Connection In multi-directional MLUTs, if one MLUT can constitute a desired logic cone, then the number of MLUTs used as connective elements decreases, which results in a decrease in the number of MLUTs used. However, if the logic cone crosses a plurality of MLUTs, the data transmission bandwidth between MLUTs is 1 bit, and thus, data goes in different directions at the connections between MLUTs, and the memory regions used as the connective elements increase. Thus, in order to configure a desired logic cone, there is a need for a plurality of MLUTs, and a case in which each MLUT is configured by clustering logic circuits is referred to as "MLUT clustering." In addition, high level programming languages such as C involve a plurality of bits. If functions coded in a programming language such as C are realized by a multidirectional-type MLUT, then the plurality of bits are calculated by bit slicing, and a data flow such as synthesizing data that has been calculated occurs, and thus, the number of MLUTs used as the connective element increases, and the number of MLUTs used increases.

If the number of data lines and address lines connected to the MLUTs is increased and the memory cell unit is increased in size as a result, then data transmission between MLUTs does not occur, and the number of MLUTs used as connective elements is reduced. However, if the number of data lines and address lines is increased in this manner, then the number of adjacently connected MLUTs also increases, and the number of input/output units in each MLUT increases in various directions, which complicates the structure.

Figure 8:
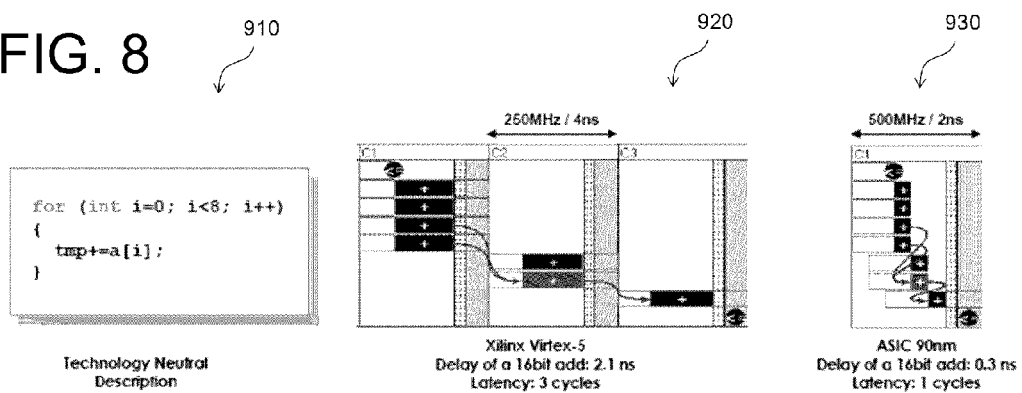
FIG. 8 shows an example of logic synthesis written in C in an FPGA.

A high level synthesis method to construct functions in C is disclosed as a method of logic synthesis of an FPGA, and has been realized. FIG. 8 shows an example of logic synthesis written in C in an FPGA. 910 is an example of code written in C. 920 is an example of high level synthesis in C in an FPGA. 930 is an example of high level synthesis in C in an ASIC. In the high level synthesis 920 written in C, with the variables in C as registers, computation therebetween is expressed in combinational circuits to construct functions. This is an example pertaining to FPGAs, and logic is broken up according to FPGA logic expressions and run. The high level synthesis 930 written in C is an example pertaining to ASICs instead of FPGAs; because logic expressions are freely made in ASICs, they can be processed all at once, and variable data is processed by registers. In this manner, the C language process is generally done by processing a data array, adding it to the register, and moving on to the next process (data path process).

As shown in FIG. 8, the data flow in C is written and controlled to construct operations, which results in a unidirectional flow of data. Thus, the data bits form data arrays of 8 bits, 16 bits, or the like. The data array length can be selected by C synthesis tools, but data arrays are generally written to be at least 3 bits.

Similarly, development of logic synthesis from a high level language such as C is also considered for MRLDs. Generally, for C synthesis, logic libraries for the target device are constricted and combinational logics are configured with reference to those libraries when writing a final combination expression. If logic libraries matching MLUTs of MRLDs are used, then this can be accomplished in principle, but in multidirectional-type MLUTs, there are no restrictions on the direction from which addresses are inputted and the direction of the data lines to which data is outputted, and thus, it is not possible to make a specific logic library.

As described above, multidirectional-type MLUTs have problems such as realizing logic cones, MLUT slicing in combinational logics from multibit processing, an increase in the number of MLUTs used as a result, the difficulty in constructing logic libraries, and the like.

(3) Bidirectional-Type MLUT

Figure 9:
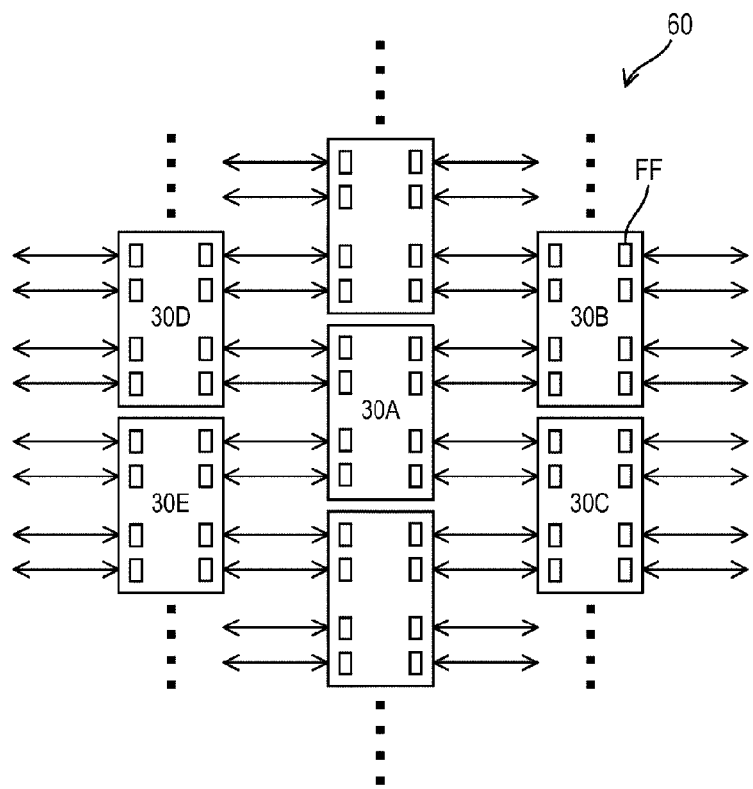
FIG. 9 shows a configuration example of MLUTs being connected to each other by a plurality of address lines or data lines.

FIG. 9 shows a configuration example of MLUTs being connected to each other by a plurality of address lines or data lines. The MLUTs 30A to 30E shown in FIG. 9 have FFs on the output end of data (I/O buffers described with reference to FIG. 3A). In the logic unit array 60 shown in FIG. 2, the MLUT 30A is connected to other adjacent MLUTs 30B to 30E through two address lines or data lines forming a pair; in other words, the connection among MLUTs is made through a plurality of address lines or data lines. In such a configuration, adjacent MLUTs are connected by a plurality of AD pairs, and thus, data transmitted to adjacent MLUTs is a plurality of bits (4 bits in the example of FIG. 2).

As shown in FIG. 9, the respective MLUTs are rectangular, and by offsetting at least a portion from the array arrangement, the output lines (also referred to as "data lines") of one MLUT are connected to the input lines (also referred to as "address lines") of two MLUTs.

Each MLUT has a plurality of input lines, and the output lines thereof are connected to the input lines of two MLUTs. In other words, if the MLUTs have at least 2×n (n being an integer of 2 or greater) of the input lines and output lines forming pairs, then the 2×n output lines from one MLUT is connected to the n number of input lines of two other MLUTs.

Also, the address lines and data lines are limited to bidirectional connection instead of multidirectional connection. In addition, while the directions are limited in number to two, the number of adjacent MLUTs is not limited to two, and is greater than two; in order to increase the number of configuration possibilities, a plurality of MLUTs can connect to each input and output side. For example, the MLUT 30A is connected to the MLUTs 30B and 30C on the right side and to the MLUTs 30D and 30E on the left side. Such MLUTs are also known as "bidirectional-type MLUTs."

Unlike the multidirectional-type MLUT, the bidirectional-type MLUT can process multi-bit data by having a plurality of data lines and address lines, and the input and output direction data flow can be limited, and thus, logic libraries can be made with ease.

In other words, because a multi-bit data process can be performed on adjacent MLUTs, it is possible to reduce the number of MLUTs used in a data process configured by a program performing multi-bit computation (written in C, for example).

(3.1) Number of Logical Stages Necessary for Bidirectional-Type MLUT

Figure 10:
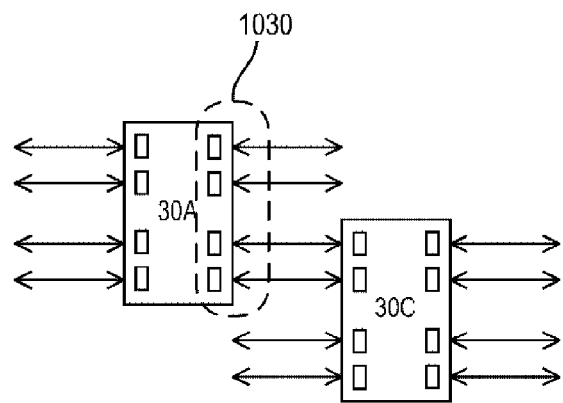
FIG. 10 is a drawing for describing an n value.

Below, the method of determining how many bidirectional-type MLUTs are necessary for a logic cone will be described using the definition of an n-value. FIG. 10 is a drawing for describing the n value, and describes the n-value using the MLUTs 30A and 30C depicted in FIG. 9. The "n-value" is defined as a number 1030 of address lines or data lines extending from each side of the MLUTs 30A and 30C facing each other. In the multidirectional-type MLUT of FIG. 1, there are as many sides as there are adjacent MLUTs, and thus, the number of address lines or data lines extending from each side is "1," meaning that the n-value is "1." The 4-bit long-type MLUT shown in FIGS. 4 and 5 is rectangular, but requires a plurality of bits to be transmitted, and thus, the number of address lines or data lines extending from each side is "4," and thus, the n-value is "4." In bidirectional-type MLUTs, as a result of the relation with adjacent MLUTs, the data transmission amount is half of the n-value, and the signal path is offset by one stage, and therefore, in order to attain the longest signal path, a number of steps equal to the signal path distance divided by (n-value/2) is required. Here, the "number of stages" refers to the number of elements connected in a circuit. The "number of stages" of the MLUTs refers to the number of MLUTs connected, like the number of stages in a normal circuit. However, as shown in FIG. 9, there are two MLUTs connected respectively to the front stage and two MLUTs connected respectively to the rear stage, and thus, the number of stages refers not to direct connection but to the number of MLUTs connected to the left, right, top, and bottom. The specific configuration thereof will be described with reference to FIG. 11B.

The number of logical stages of MLUTs is represented in the following formula.

$$\text{number of logical stages of MLUT} = m/(n\text{-value}/2). \quad \text{Formula 1}$$

Here, m is the signal bus, and indicates an input signal line to be the logic cone.

In the example shown in FIG. 10, the n-value is "4," but there are two adjacent MLUTs in each direction, and thus, the (n-value/2) is equal to "2." The logical computation in the C language is performed in 8 bits, and if there are eight logic cone input signal lines m, then the number of MLUT logical stages is 8/(4/2)=4. In other words, if 8-bit computation is performed by MLUTs, MLUTs constituting four stages are required.

Figure 11A:
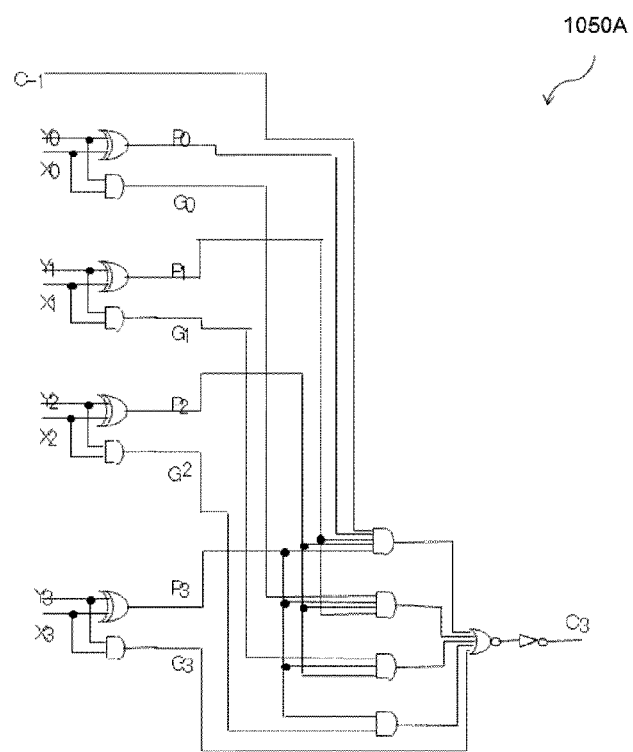
FIG. 11A shows an example of a circuit forming a logic cone.

FIG. 11A shows an example of a circuit forming a logic cone. A circuit 1050A shown in FIG. 11A performs logic calculation indicating the following formula on signal paths (X0, Y1 to X3, Y3, C−1), which are nine data lines, and outputs the result to the logic value C3. In other words, the circuit shown in FIG. 11A is a logic cone performing 9-bit calculation.

$$C3 = G3 + G2 \cdot P3 + P2 \cdot P3 \cdot G1 + P1 \cdot P2 \cdot P3 \cdot G0 + P3 \cdot P2 \cdot P1 \cdot P0 \cdot (C-1) \quad \text{Formula 2}$$

Figure 11B:
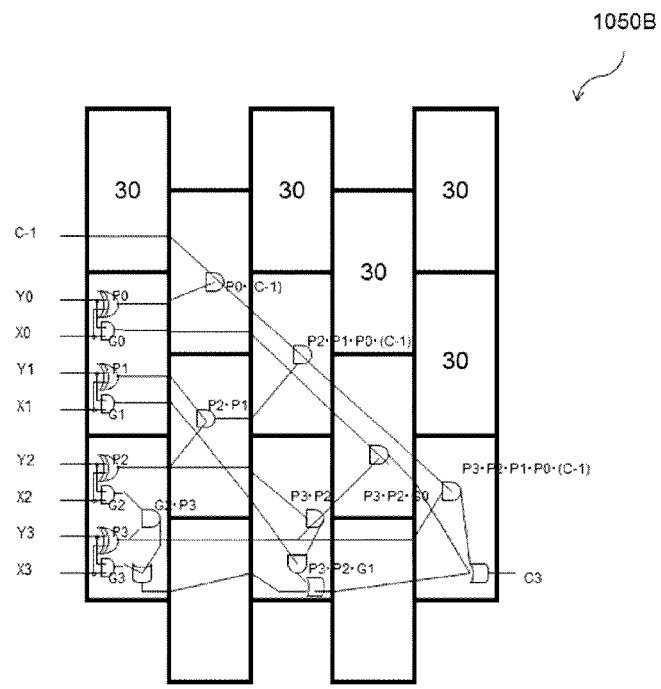
FIG. 11B shows a plurality of MLUTs realizing the logic cone shown in FIG. 11A.

FIG. 11B shows a plurality of MLUTs realizing the logic cone shown in FIG. 11A. The n-value of MLUTs in FIG. 11B is 4. There are nine signal paths in the logic cone, and thus, the number of MLUT logic stages is 9/(4/2)=4.5; therefore, there is a need for MLUTs constituting five stages, which is an approximation of 4.5. In FIG. 11B, a plurality of MLUTs configuring the logic cone described in FIG. 11A are shown, but the number of MLUTs connected to each other regardless of which direction (left, right, top, bottom) is five. Here, the connection of the respective MLUTs 30 constituting the logic cone and the logic calculation become clear, and thus, truth table data of the MLUTs can be generated.

(2.2) Example of Bidirectional-Type MLUT Slicing

Figure 12:
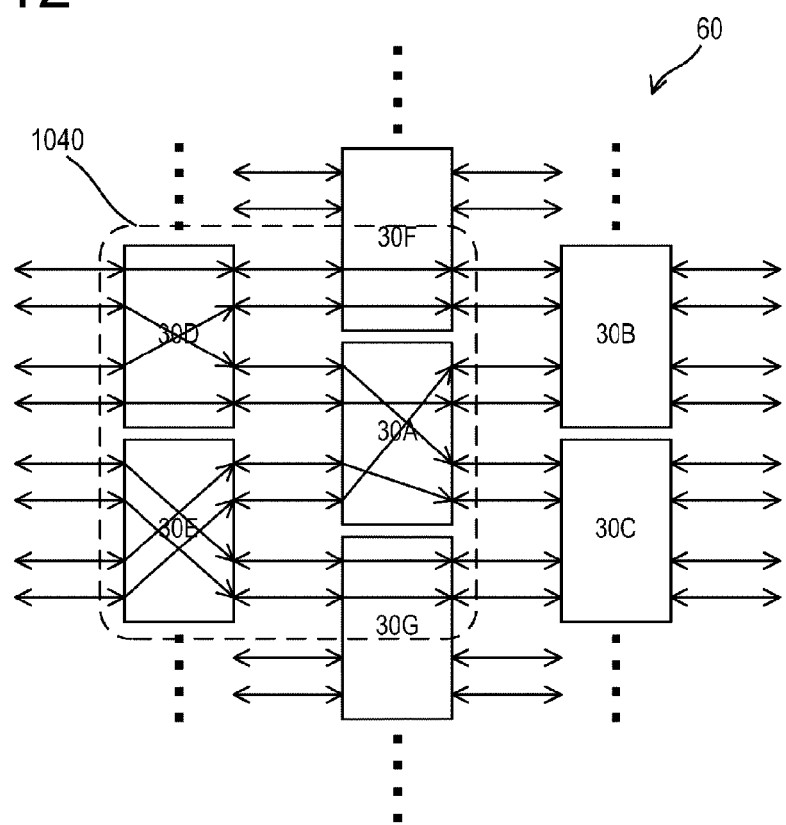
FIG. 12 shows an example of slicing bidirectional type MLUTs.
Figure 13:
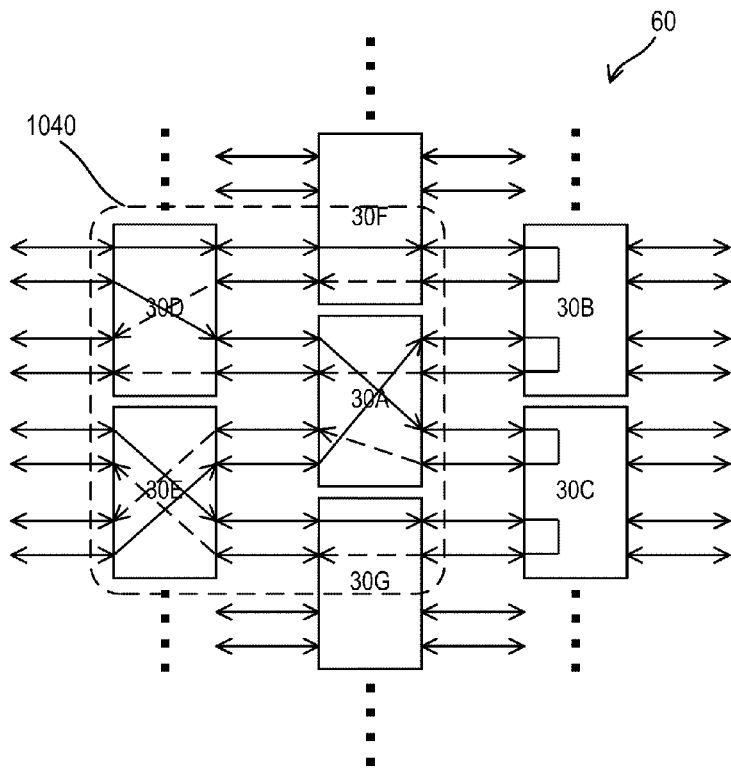
FIG. 13 shows an example of slicing bidirectional type MLUTs.
Figure 14:
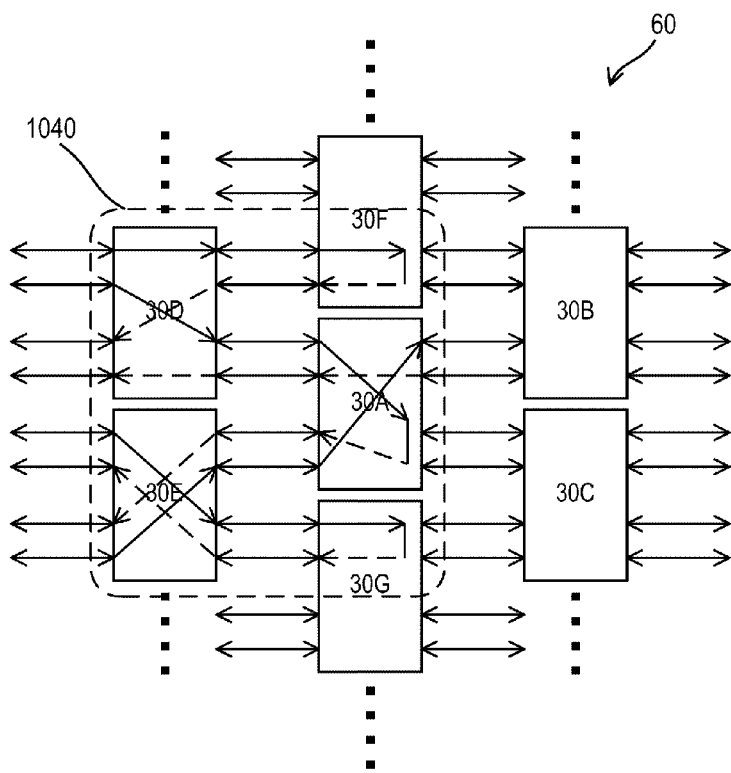
FIG. 14 shows an example of slicing bidirectional type MLUTs.

FIGS. 12 to 14 show examples of slicing bidirectional type MLUTs. FIG. 12 is a drawing of MLUTs having data connections to the right. In FIG. 12, 1040 shows the number of logical stages in the MLUTs necessary for 8-bit input. As shown in FIG. 12, by slicing a combinational circuit constituting a logic cone by the number of logical stages in the MLUT, MLUT slicing can take place. Logical computation can be performed on the combinational circuit that has undergone MLUT slicing for all input combinations (equal to $2^n$ if the n-value is used), and the truth table data of this logical computation can be determined.

FIGS. 13 and 14 show a connection allowing data to return by bidirectional-type MLUTs. The MLUTs are connected bidirectionally, and thus, by using a plurality of MLUTs, data connection allowing data to return from the right to the left can be used. The examples shown with the dotted lines indicate a connection allowing data to return. Although the right direction flow is not shown, data flows to the left to return, while maintaining the right direction flow indicated with the reference character 1040 in FIG. 12. FIG. 13 shows an example in which the MLUTs 30B and 30C have a connection allowing the return of data, and FIG. 14 shows an example in which the MLUT 30A performs logical computation and has a connection allowing the return of data.

Using two memory cell unit-type MLUTs, which already have a restricted circuit configuration, for the return connection can reduce the number of unused memory cells, and is therefore effective.

As shown in FIG. 13, if, in the bidirectional-type MLUT, truth table data returning a signal to an MLUT terminal is written, then the signal can be returned. Also, in this example, return direction truth table data is separately required in addition to outbound direction truth table data, and thus, one MLUT needs to store the return direction truth table data in addition to the outbound direction truth table data, thereby allowing the number of MLUTs to be reduced. Conventionally, as shown in FIGS. 13 and 14, bidirectional-type MLUTs had a configuration allowing return processing. However, the MLUT of the present embodiment is configured such that one MLUT stores two pieces of truth table data each realizing data flow in both directions, thereby clearly differentiating both pieces of truth table data.

(2.3) Bit Slicing in Bidirectional-Type MLUT

A logic configuration method by which the C programming language allows the truth table data to be directly determined will be described. The int computation in C is 16 bits, for example. Thus, a 16 bit register is generated, and the bit value stored in the register is computed, thereby realizing the combinational circuit. If there is an MLUT that has a 16-bit n-value, then operations can be performed by storing the result as truth table data, but MLUTs having an n-value of 16 use 16 addresses and require $2^{16}$ memory cells, and thus, if MLUTs are used as the component unit, then this results in a large amount of unused memory regions, making this configuration unrealistic. A solution is to slice bits to convert to the MLUT-based computation method. If there is an MLUT having an n-value of 4, then C language code dividing 16 bits into four parts is written. Doing so in C is common. For example, 32 bit calculation is done using the float variable type, but can be coded as an int.

Figure 15:
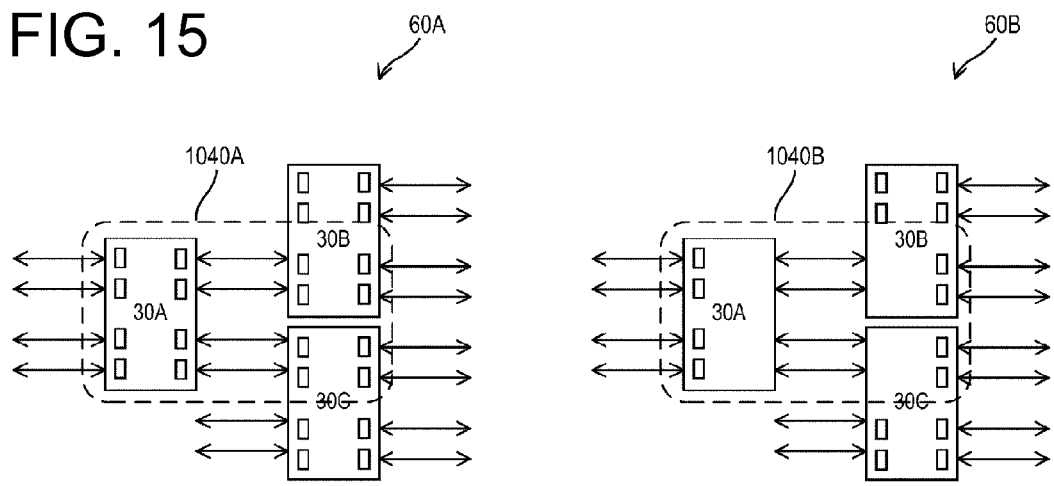
FIG. 15 shows an example of using an FF in bidirectional type MLUTs.

FIG. 15 shows an example of using an FF in bidirectional type MLUTs. If code to slice the 16 bits into 4-bit pieces is written in C, then MLUT logical stages shown in 1040A and 1040B are determined. 60A is an example in which respective FFs of the MLUTs are used in a logic circuit, and 60B is an example in which FFs are not used in the logic circuit. FFs being present in the respective MLUTs results in a clock delay, and thus, operation speed can be increased by stopping usage of FFs as shown in 60B in which FFs are not used in intermediate MLUTs.

(3) Logic Configuration Device

In order to perform logical configuration of an MRLD, there is a need for a logic configuration method in which a netlist is generated by a hardware description language relating to abstract circuit operation, and the netlist is assigned to an actual digital circuit (hereinafter referred to as "logic synthesis"). The "netlist" is data of connective information between terminals in an electronic circuit. In the technical field of electronic circuits, the signal line connecting terminals or the connection between terminals is referred to as a "net." An example of including MRLD functions is a method of selecting a group of circuits in which logic synthesis has been performed and sequentially arranging them from input pins. However, the arrangement must be made so as to secure an area for circuits to be arranged later.

Registers and the calculations therebetween are the main operation in the C language, and because registers are FFs and calculation is combinational logic, logic synthesis can generally be performed in C. The arrangement of FFs is decided by register declaration, and truth table data is generated from the calculation operation, and thus, logic synthesis is possible even without logic circuit synthesis. Conventionally, logic synthesis in reconfigurable semiconductor devices, and in particular, synthesis using C needed to be performed by logic configuration involving temporary conversion to RTL description (Verilog, VHDL), and then, generating a logic circuit. Thus, data processes needed to be performed a few times, resulting in a complex process. In the logic configuration method of the present embodiment, logic synthesis by C is possible and simple.

In the case of MRLDs, formation of a truth table and writing the truth table to the MLUTs corresponds to the logic configuration of FPGAs.

Figure 16:
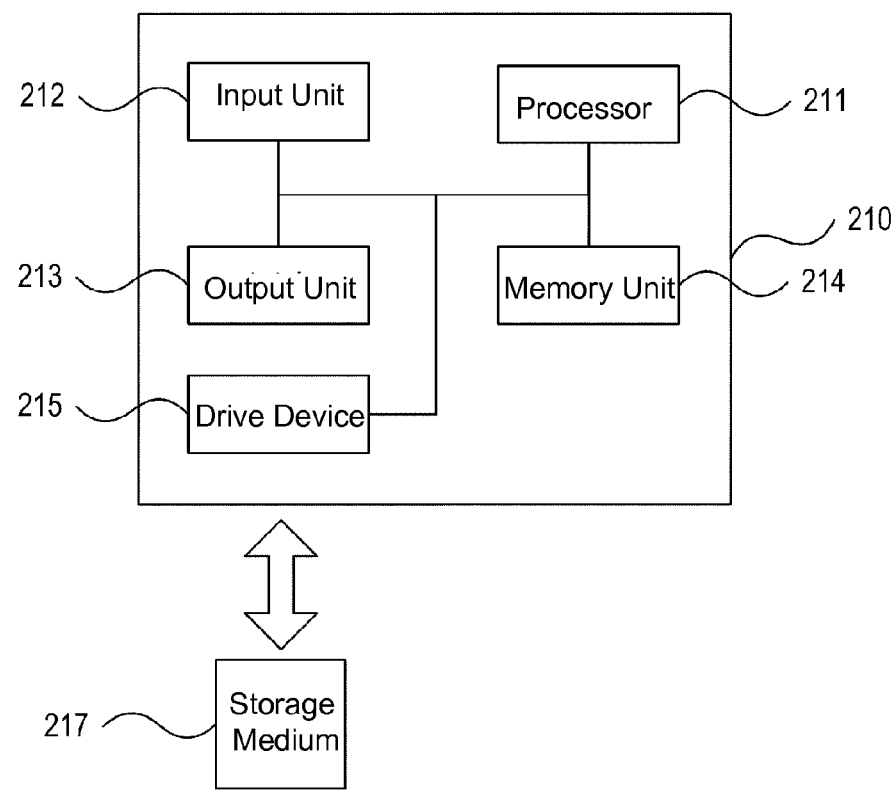
FIG. 16 shows an example of a hardware configuration of a data processing device.

A logic configuration device is realized by a data processing device of the present embodiment that executes a software program for logical configuration. FIG. 16 shows an example of a hardware configuration of a data processing device. The data processing device 210 has a processor 211, an input unit 212, an output unit 213, a memory unit 214, and a drive device 215. The processor 211 stores in the memory unit 214 software for arrangement/wiring inputted to the input unit 212, C programming code or code in a circuit description language such as a hardware description language (HDL) for designing an integrated circuit, and truth table data generated by executing the aforementioned software. The processor 211 executes the software for arrangement/wiring, performs an arrangement/wiring process described below on the circuit description stored in the memory unit 214, and outputs truth table data to the output unit 213. An MRLD 20 (not shown in FIG. 16) can be connected to the output unit 213, and the processor 211 executes the logic configuration process and writes the truth table data generated as a result to the MRLD 20 through the output unit 213. The output unit 213 may be connected to an external network. In such a case, the software program for logic configuration is transmitted/received through the network. The drive device 215 is a device for reading from and writing to a storage medium 217 such as a DVD (digital versatile disc) and flash memory, for example. The drive device 215 includes a motor for rotating the storage medium 217, a head for reading/writing data on the storage medium 217, and the like. The storage medium 217 can store a program for logic configuration. The drive device 215 reads the program from the set storage medium 217. The processor 211 stores the program read by the drive device 215 in the memory unit 214. The data processing device 210 operates as a logic configuration device that executes the logic configuration method of the present embodiment.

(4) Logic Configuration Method

In the logic configuration method of the present embodiment, a netlist describing logic circuit data, sequential logic data, and connective information of the logic circuit data and the sequential logic data is generated from circuit description (HDL, etc.) describing a circuit configuration, and from the generated netlist, the logic circuit data and the sequential logic data are respectively assigned to the memory cell and the logic circuit element according to the connective information.

The step of generating the netlist includes generating logic circuit data, sequential logic data, and a parallel-in/serial-out shift register (parallel/serial conversion shift register) including the logic circuit data.

In the logic circuit simulation, a method is used in which wiring information is displayed using a terminal name and not using the wiring information between device and node. In the logic configuration method of the present embodiment, netlist information is held in the logic circuit level including the logic elements, FFs, and the like. Data including correspondences between terminal names and nodes is held, allowing confirmation after conversion to be performed with ease, and simplification of the circuit and reconfiguration of the circuit block using the device becomes easy.

Figure 17:
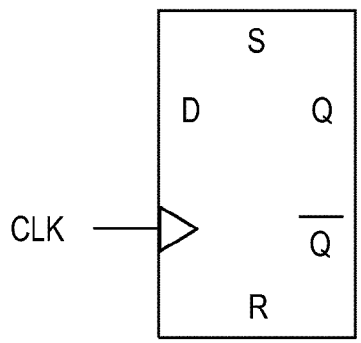
FIG. 17 is a drawing for describing the difference between circuit description and device-level netlists.
Figure 17:
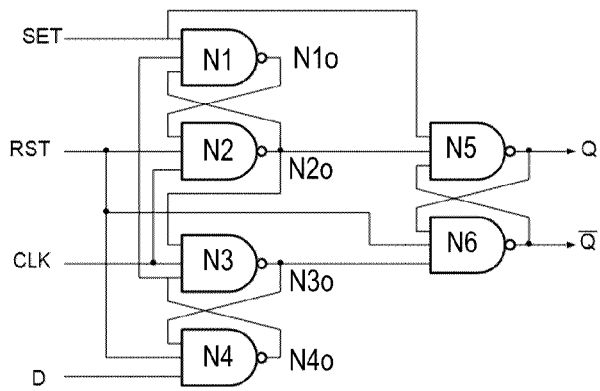
Figure 17:
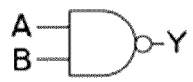
Figure 17:
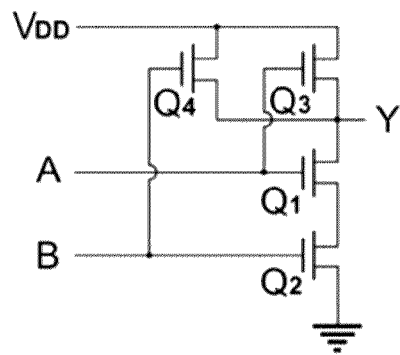

FIG. 17 is a drawing for describing the difference between circuit description and device-level netlists. 940A in FIG. 17 represents the FF circuit block, 940B represents the FF circuit symbol, and 940C represents the FF transistor level circuit diagram.

Examples of descriptions for 940A include "FF1, FF2, FF3, and FF4." The circuit description is written as follows in 940B.

Moduledff(q,d,clk);
inputSET,RST,clk,d;
outputq,q(-);
wireSET,RST,clk,d;
wiren1o,n2o,n3o,n4o;
nandn1(n1o,SET,n4o,n2o);
nandn2(n2o,RST,n1o,clk);
nandn3(n3o,n4o,n2o,clk);
nandn4(n4o,d,RST,n3o);
nandn5(q,SET,n2o,q(-));
nandn6(q(-),RST,n3o,q);
endmodule The circuit description is written as follows in 940C.
NAND(VDD:3,A:1,B:2,Y:4,GND:0)
⇒ *ACMOSNANDgate
MP34133CMOSPW=28.0UL=2.0UAS=252P
AD=252P
MP44233CMOSPW=28.0UL=2.0UAS=252P
AD=252P
MN14150CMOSNW=10.0UL=2.0UAS=90PAD=90P
MN25200CMOSNW=10.0UL=2.0UAS=90PAD=90P
.MODELCMOSNNMOS(~)
.MODELCMOSNPMOS(~)

As shown in FIG. 17, in the logic configuration method of the present embodiment, a netlist of the logic circuit level 940B is generated, and not a netlist of the transistor level 940C using a circuit description language.

Figure 18:
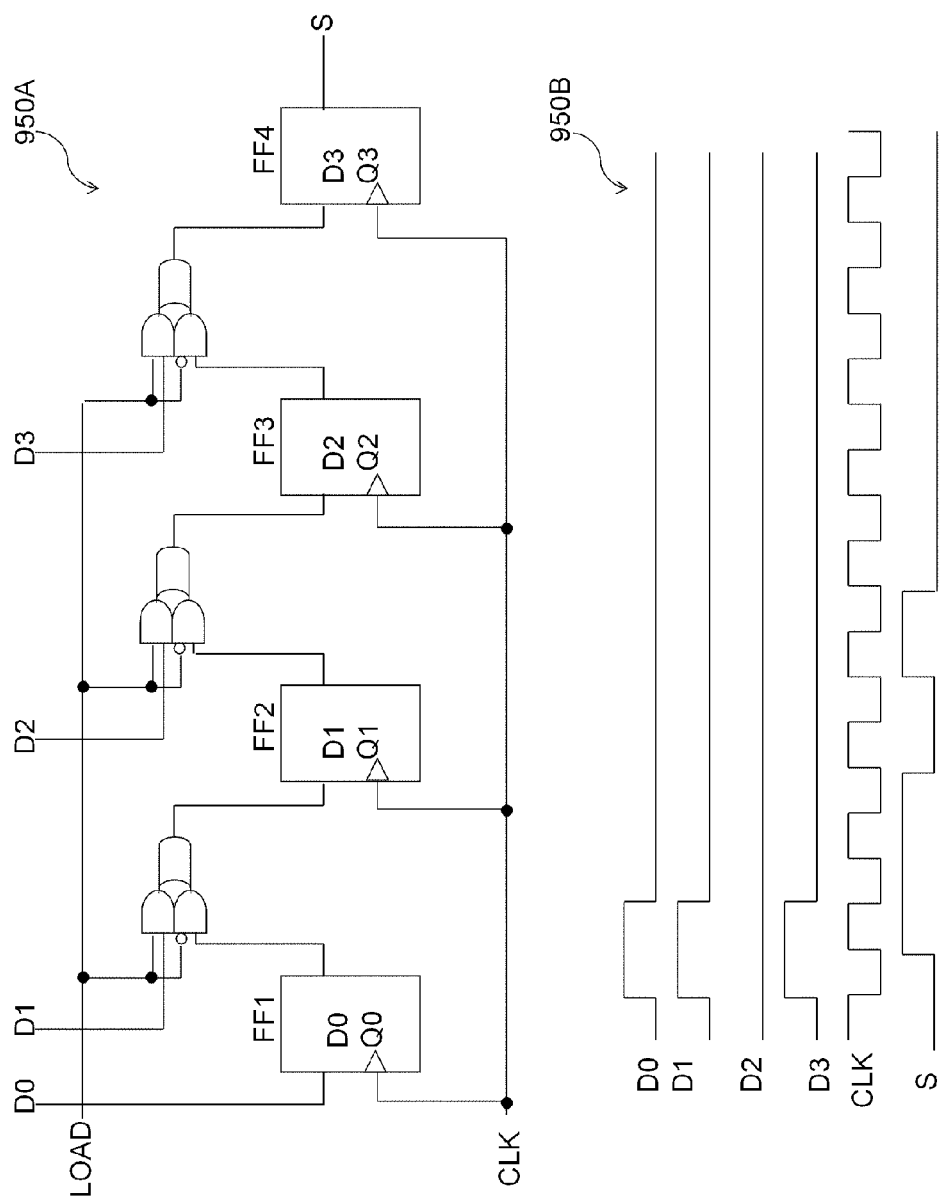
FIG. 18 shows an example of a parallel/serial conversion shift register realized by a reconfigurable semiconductor device.

FIG. 18 shows an example of a parallel/serial conversion shift register realized by a reconfigurable semiconductor device. The circuit diagram 950A of the parallel/serial conversion shift register shown here is a sequential logic mechanically realized by MLUTs 30, and is physically realized by I/O buffers 12 shown in FIG. 3A. 950B is a time chart of the parallel/serial conversion shift register shown in FIG. 18.

Figure 19:
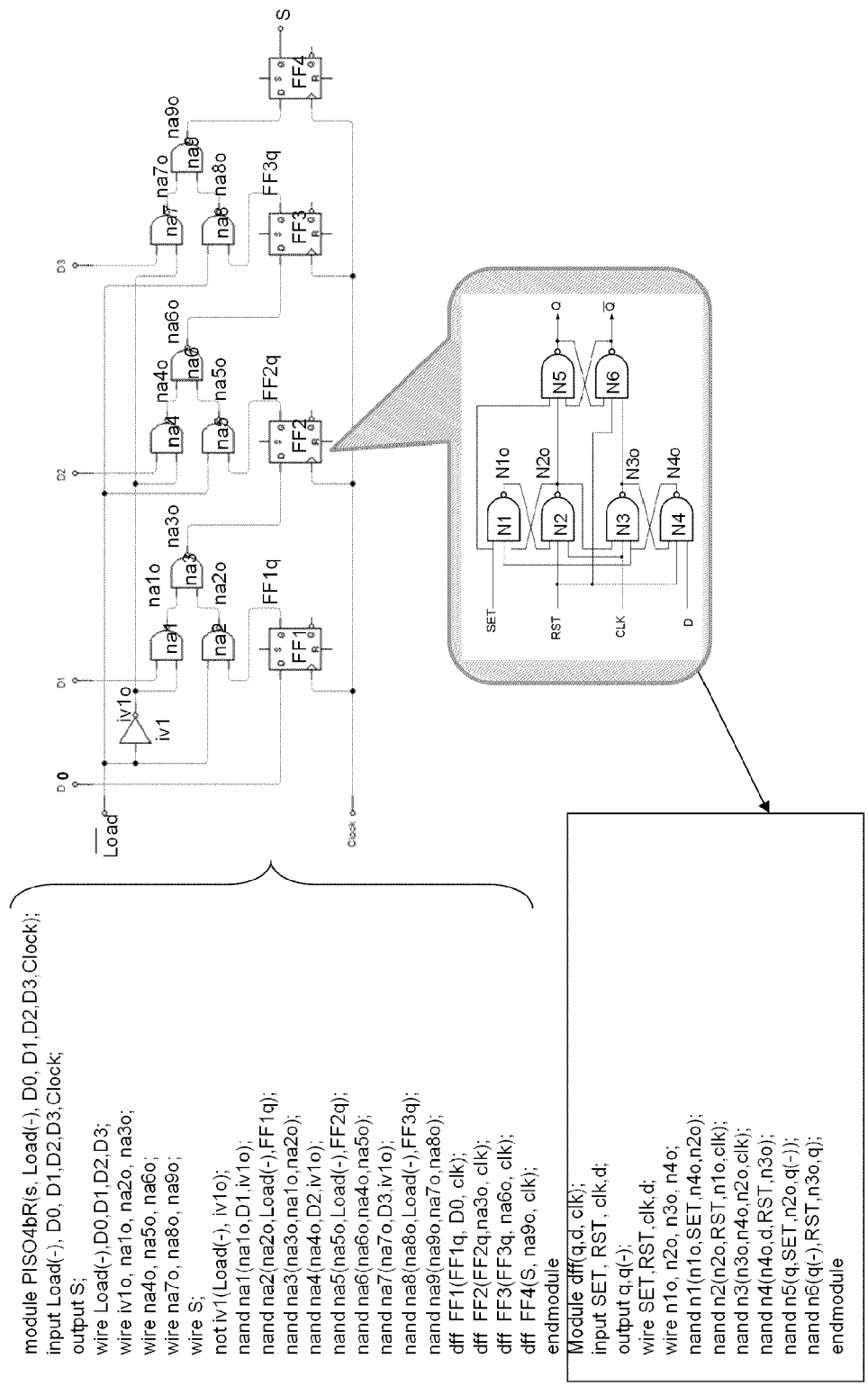
FIG. 19 shows an example of circuit description for reconfiguring the circuit of FIG. 18.

FIG. 19 shows an example of circuit description for reconfiguring the circuit of FIG. 18. The circuit description of FIG. 19 is written in Verilog-HDL, but is written at the logic circuit level and not the element level. Circuit descriptions of the internal structure of FFs are also made.

Figure 20:
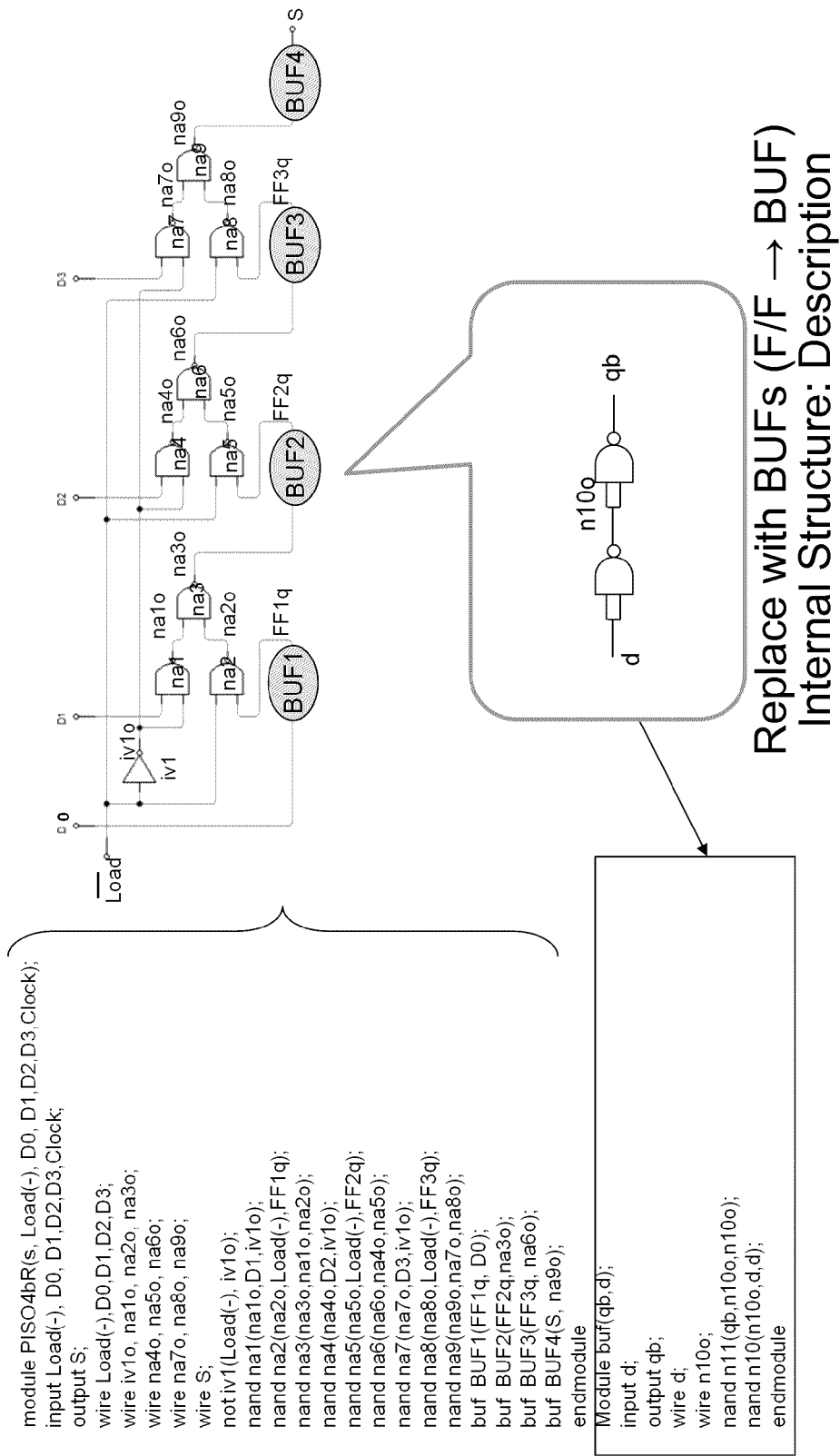
FIG. 20 shows another example of circuit description for reconfiguring the circuit of FIG. 18.

FIG. 20 shows another example of circuit description for reconfiguring the circuit of FIG. 18. In the circuit description of FIG. 20, the FFs are realized by gates.

Furthermore, as shown in FIGS. 11A and 11B, a logic cone including a sequential logic is extracted, a portion of the logic cone is formed to match a number resulting from dividing the number of input lines to the logic cone by n/2, and truth table data to be stored in the memory cell unit is generated.

Figure 21:
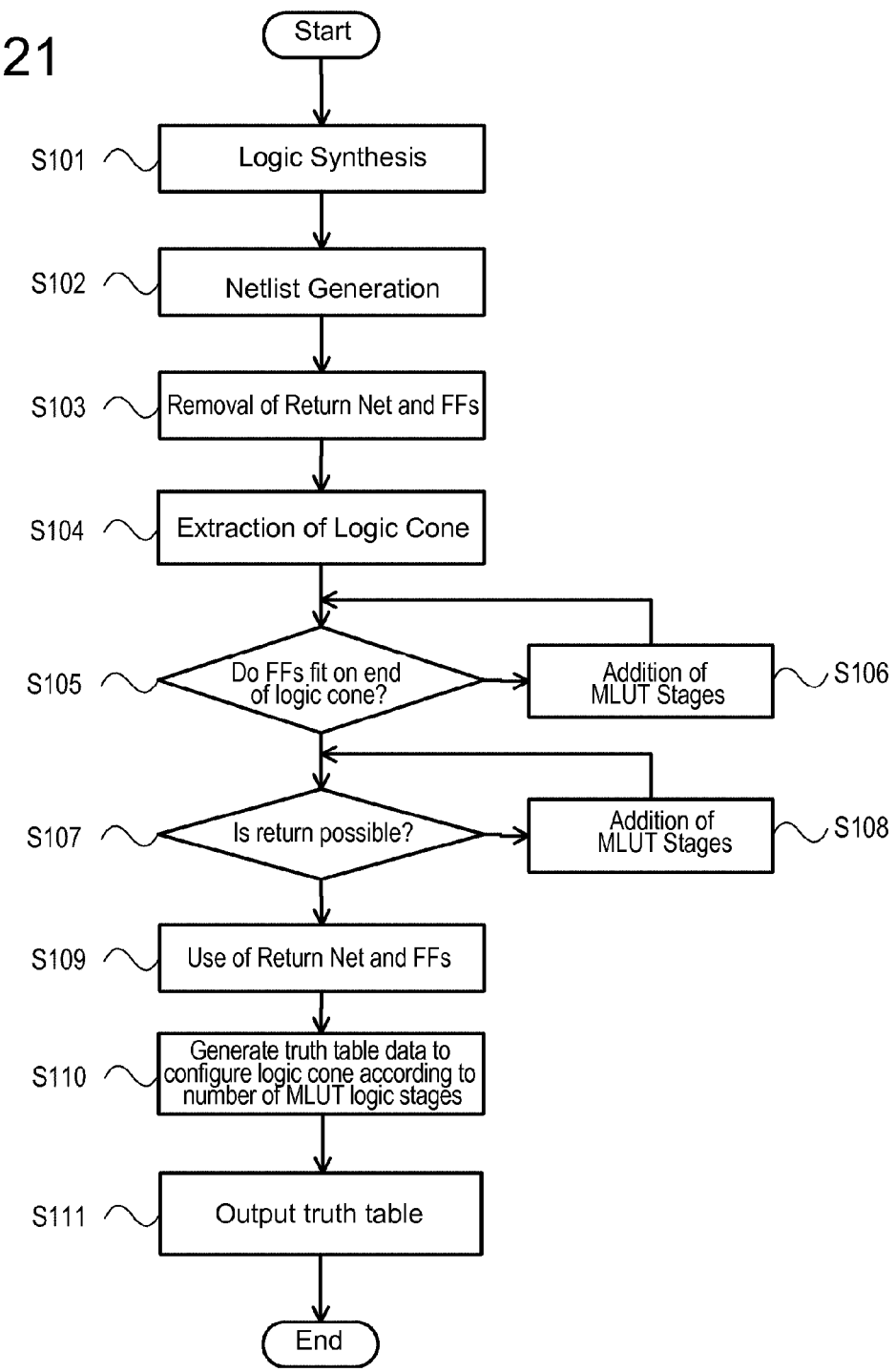
FIG. 21 is a flowchart showing one example of a logic configuration process.
Figure 26:
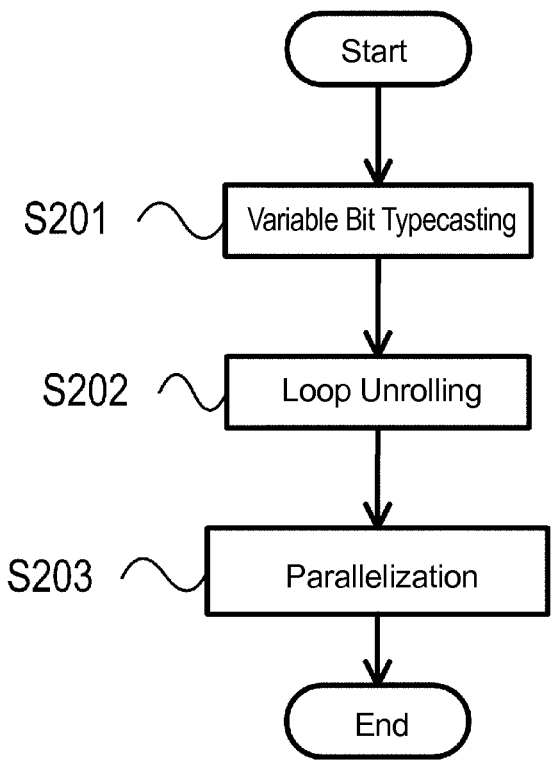
FIG. 26 shows an example of a process to generate a netlist on the basis of a high level language such as C.

FIG. 21 is a flowchart showing one example of a logic configuration process. The logic configuration process is executed by the data processing device shown in FIG. 16. First, by performing logic synthesis (S101), a netlist having connective information of a circuit is generated on the basis of a circuit description that describes a circuit configuration. According to one example, these processes generate a netlist on the basis of a high level language such as C, and details of the processes are shown in FIG. 26.

Next, a return net and FFs are removed from the netlist and replaced with a buffer (S103). At this time, it is possible to store the connective information and apply the deleted return net and the FFs to S109 to be described later.

A logic cone including a sequential logic is extracted (S104). There are two methods of extracting the logic cone: a process of directly generating a logic cone from the generated netlist, and a process of separating from the netlist the scanned sequential logic data set and glue logic and extracting the logic cone from the glue logic. The latter will be mentioned with reference to FIG. 28.

Figure 22:
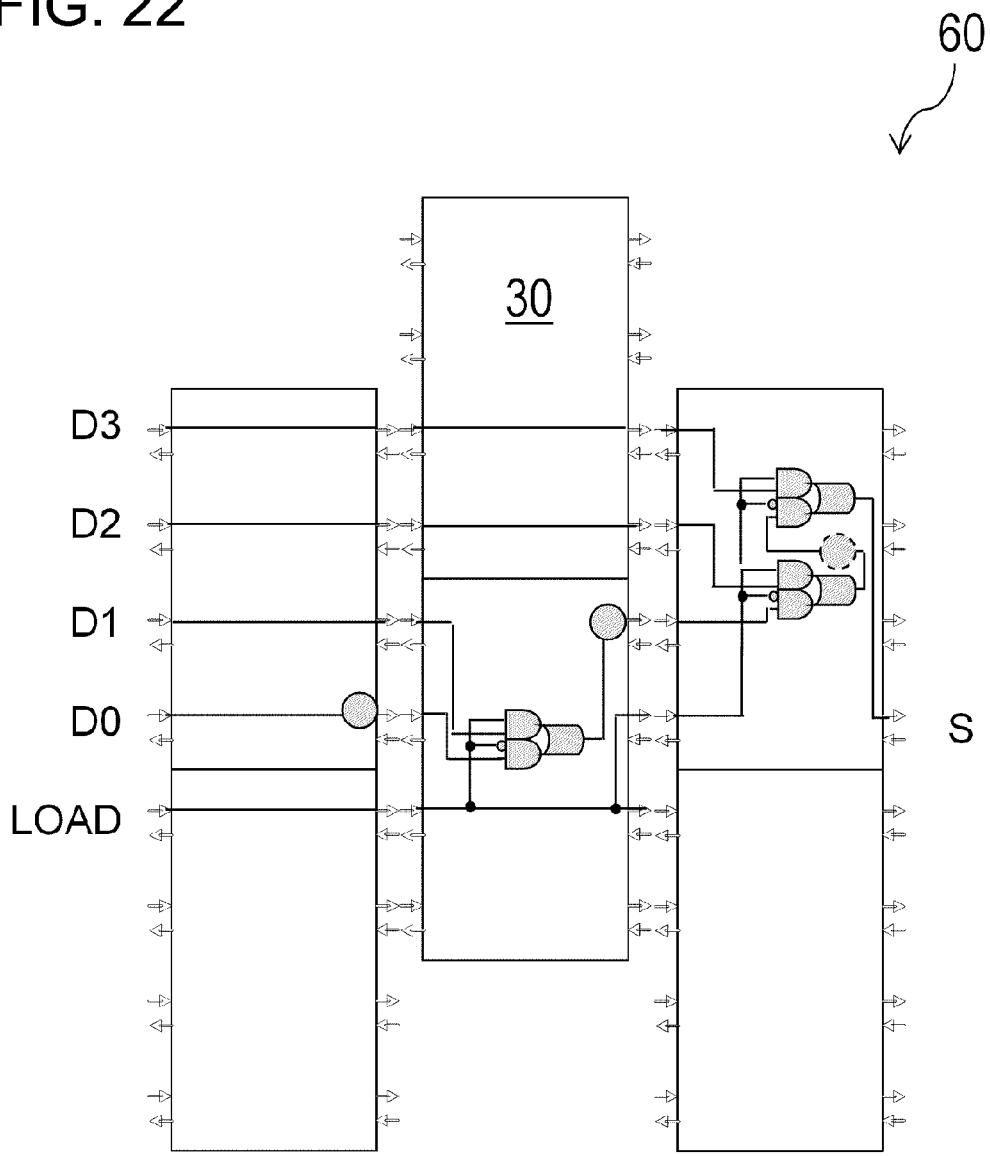
FIG. 22 shows an example in which FFs fit in the end of the logic cone.

Next, it is determined whether or not FFs fit in the end of the logic cone (S105). FIG. 22 shows an example in which FFs fit in the end of the logic cone. The flip-flop output S is outputted from MLUTs forming the logic cone, and thus, the FFs fit in the end of the logic cone.

Figure 23:
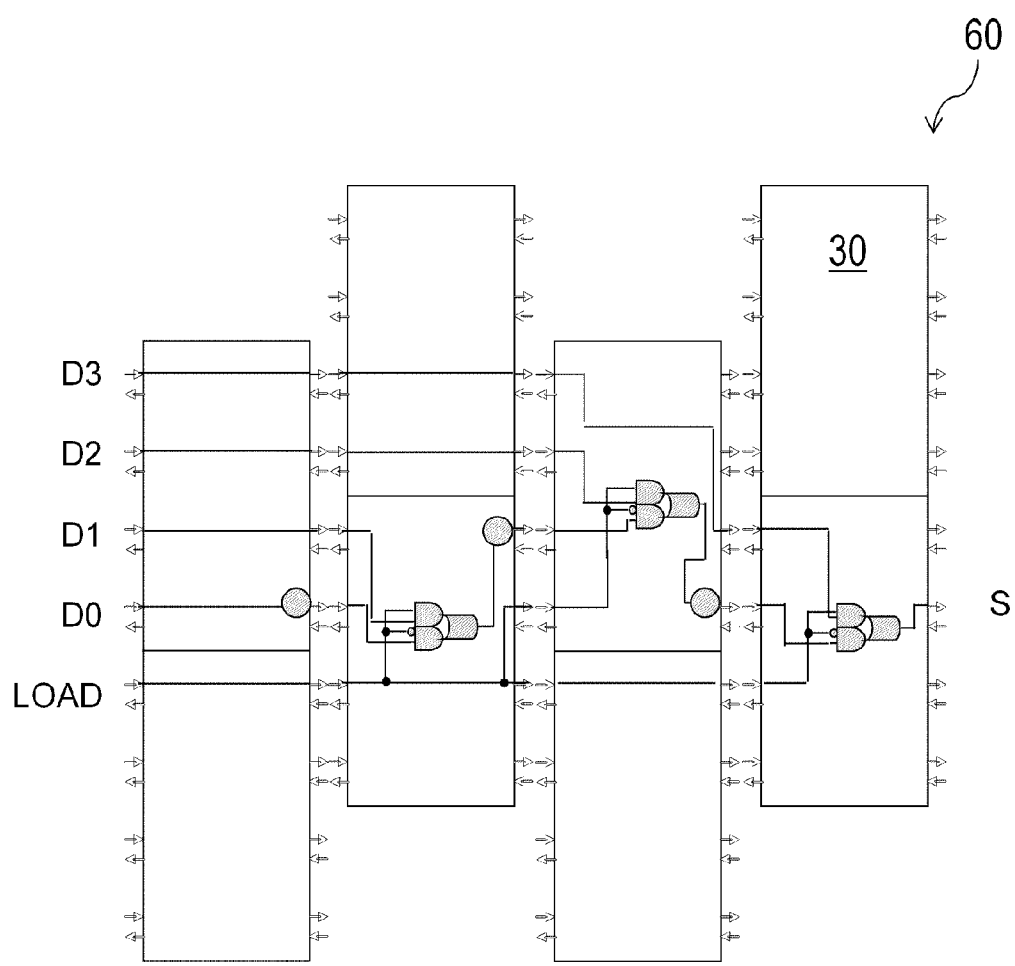
FIG. 23 shows an example in which FFs fit in the end of the logic cone.

FIG. 23 shows an example in which FFs do not fit in the end of the logic cone. The MLUTs 30 at the end of the logic cone need to have four inputs and one output, and as shown in the drawing, the MLUTs satisfy this input/output requirement.

Figure 24:
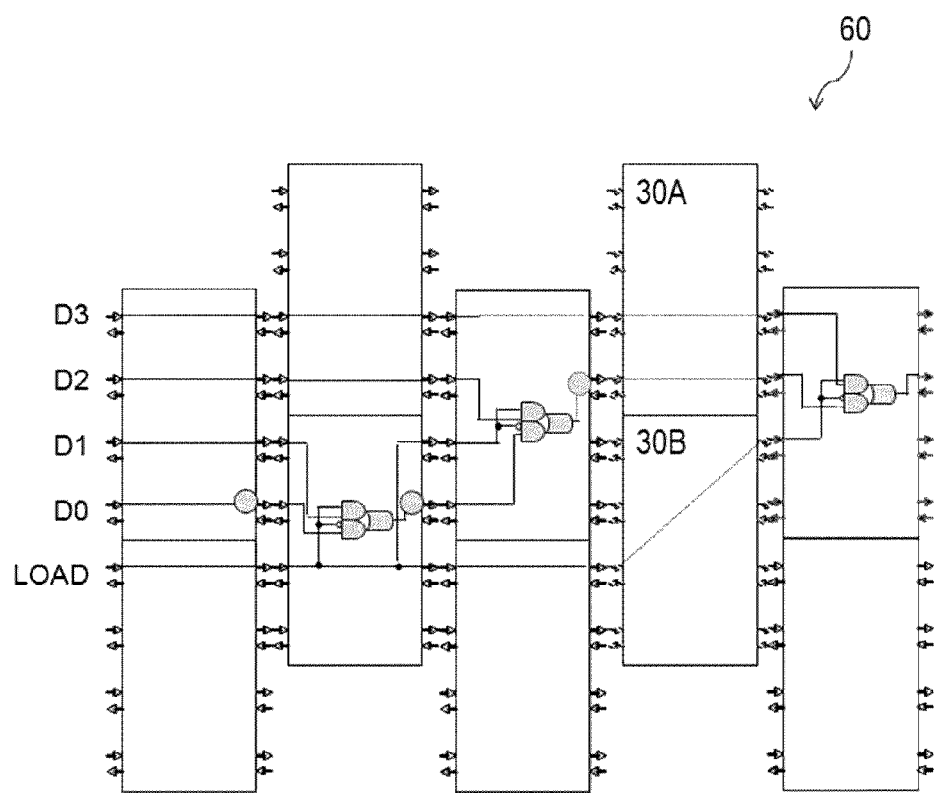
FIG. 24 shows an example of adding MLUTs for return operation.

FIG. 24 shows an example of adding MLUTs for return operation. If there is a return in FIG. 22, then the MLUTs do not alternately overlap, and thus, an additional MLUT stage is added. In such a case, the number of MLUT stages is increased (S106) and the FFs are disposed at the end of the logic cone.

Figure 25:
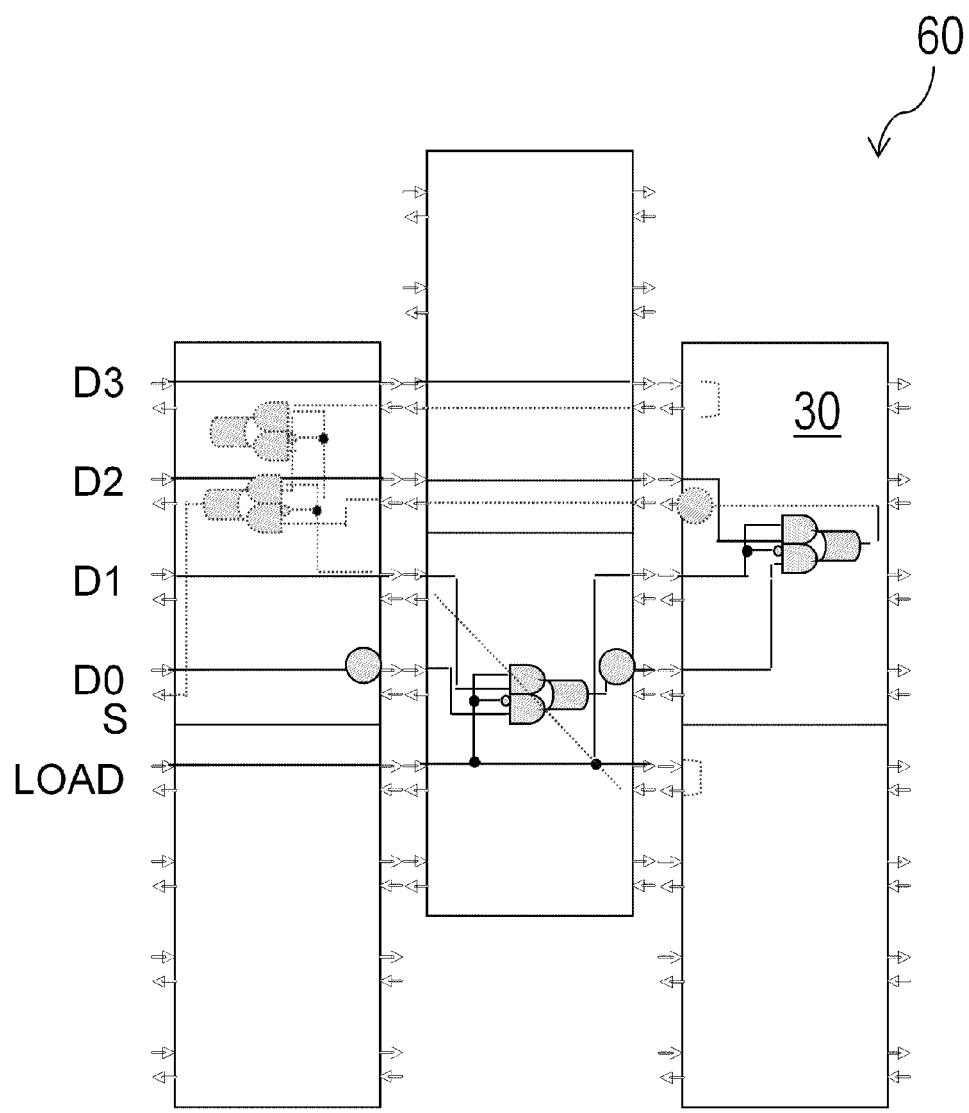
FIG. 25 shows an example of return processing using bi-directional MLUTs.

FIG. 25 shows an example of return processing using bi-directional MLUTs. In the return processing also, it is similarly determined whether or not the FFs fit in the end of the logic cone (S107), and if there are no FFs in the end, an additional stage of MLUTs is added (S108).

If the logic cone has been allocated, then the return net and the FFs removed in step S103 are allocated to the MLUTs (S109).

Next, truth table data for the plurality of MLUTs constituting the logic cone are generated by the number of MLUT logic stages (number of stages of MLUTs corresponding to the result of dividing the number of input lines to the logic cone by n/2). The generation of truth table data includes the generation of first and second truth table data for return processing of a two-memory cell unit MLUT. In other words, in this step, the first truth table data for outputting logic values from one side based on address input on the one side and the second truth table data for outputting logic values from the other side are generated. The first truth table data is truth table data outputted to the first plurality of data lines on the one side of the memory unit selected by the decoded signal of the address inputted from the one side, and the second truth table data is truth table data outputted to the second plurality of data lines on the other side of the memory unit.

Next, the truth table data is outputted to the MRLD (S111), and the process is finished. Operation validation by allocating the truth table data to an MRLD simulated by a logic configuration device may be performed instead of S111.

(4.1) Generating Netlist from High Level Language

FIG. 26 shows an example of a process to generate a netlist on the basis of a high level language such as C. Bidirectional-type MLUTs have a plurality of address inputs, but a high level language such as C involves 32 bit calculation processing and the like, and there is a need to perform bit slicing on the number of address inputs of the MLUT.

First, the variable bits in the program coded in the high level language are typecast to a smaller bit size (S201). For example, bits of a float variable type are typecast to bits of an int type, which has a smaller bit size. As a result, the calculation becomes relatively closer to the number of inputs of MLUTs, which allows the logic cone to be made smaller. Next, loop unrolling is performed (S202). By loop unrolling, the number of "loop complete" condition tests generated every iteration of the loop is reduced, and thus, the number of truth table data can be reduced. Next, parallelization processing is performed (S203). During parallelization processing, a process is divided into a number of smaller processes, and the smaller processes are synchronized and executed in parallel to attain a final result. MRLDs can receive multiple inputs and multiple outputs, and thus, parallelization processing is easy. In this manner, the MRLD processing power is improved.

(4.2) Scanning

Figure 27:
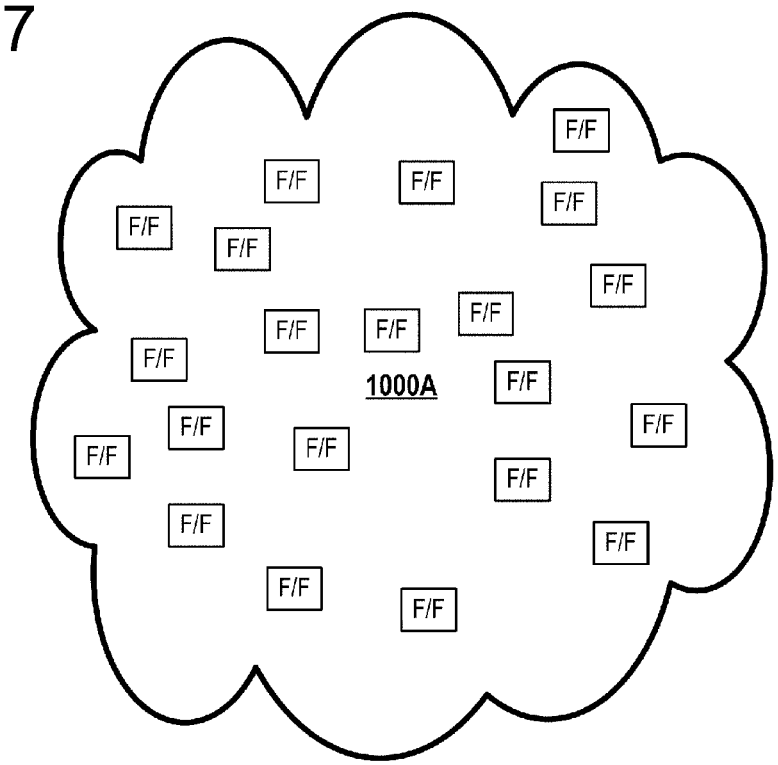
FIG. 27 is a schematic view of a glue logic 1000A and FFs indicated by the generated netlist.
Figure 28:
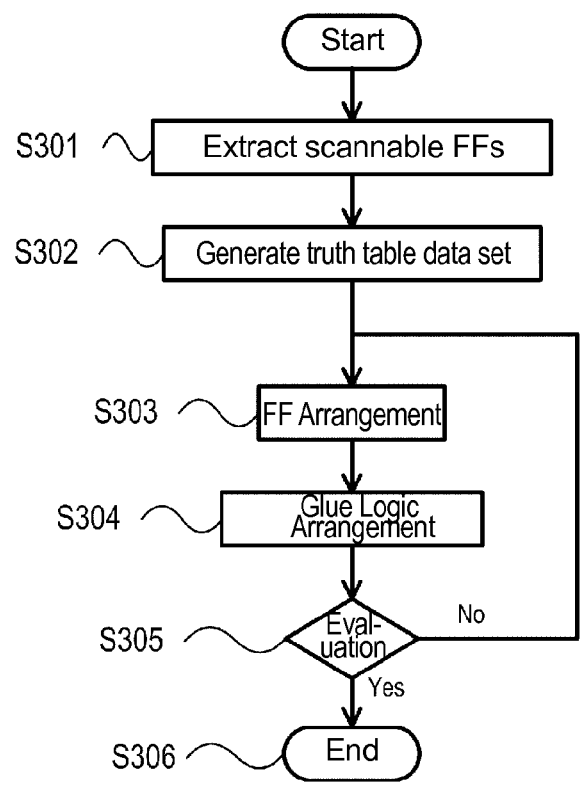
FIG. 28 is a flowchart showing a process of extracting a logic cone from a scanned sequential logic data set and a separated glue logic.

FIG. 27 is a schematic view of a glue logic 1000A and FFs indicated by the generated netlist. The logic circuit has a combinational logic and a sequential logic, and the combinational logic circuit is referred to as a glue logic. FIG. 28 is a flowchart showing a process of extracting a logic cone from a scanned sequential logic data set and a separated glue logic.

Scannable FFs are extracted from the generated netlist (S301). Scanning means optimizing the arrangement of FFs in registers inside the logic circuit by replacing FFs inside the circuit on which logic synthesis has been performed with FFs having a scan function (scan FFs), thereby achieving an optimal arrangement of FFs. If the FFs are scanned randomly, then the wiring becomes complex, which makes it impossible to configure an effective and short chain wiring, and thus, extraction is performed such that the optimal and shortest chain is formed based on the logic state.

Figure 29:
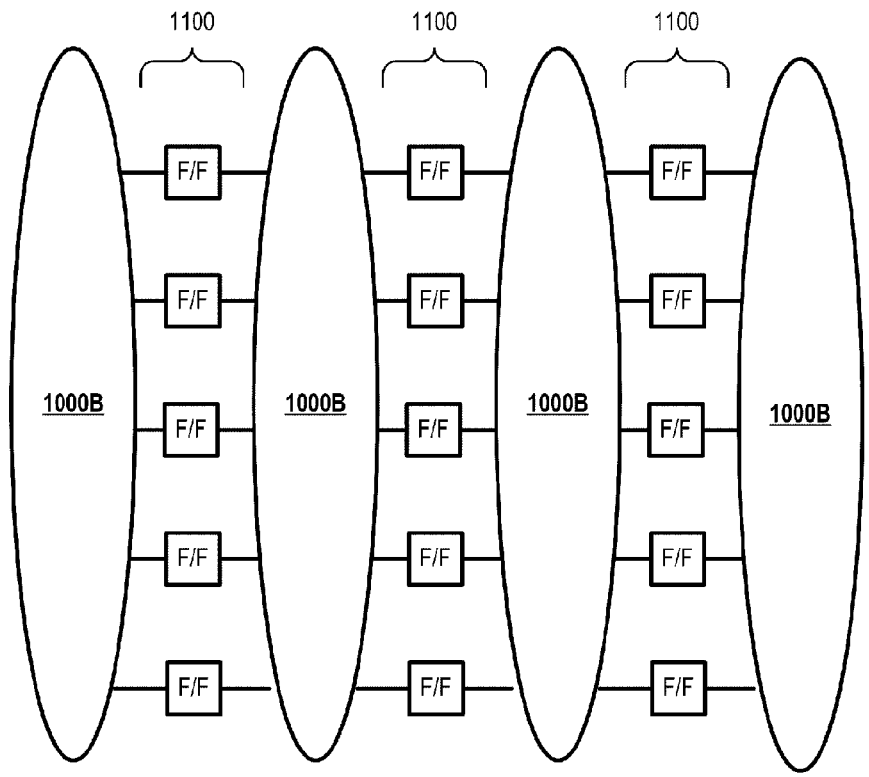
FIG. 29 schematically shows glue logics newly generated by scanning and scan FFs.

FIG. 29 schematically shows glue logics newly generated by scanning, and scan FFs. By scanning, the glue logic 1000A of FIG. 27 is configured to be glue logics 1000B connected to scan FFs 1100, and the FFs in the circuit shown in FIG. 27 are replaced with scan FFs 1100. In this manner, the scan FFs 1100 are interposed between the glue logics 1000B. When comparing FIG. 27 to FIG. 29, the connective relation between the glue logic and FFs is simpler in FIG. 27. By such simplification, it is possible to greatly reduce the number of wiring logic units needed for connection between the FFs and the glue logic.

Up to now, the logic configuration of MRLDs did not distinguish between combinational logics and sequential logics, and the circuits were wired by disposing them on MLUTs. In MRLDs, combinational logics or wiring lines that are MLUTs were configured by memory information, and thus, if the glue logic and FFs are jumbled together and logic configuration is performed as is as shown in FIG. 27, then wiring logic units for connecting FFs to combinational logic circuits become necessary, which increases the number of wiring logic units and reduces synthesis efficiency. However, if the sequential logics are arranged first, then the number of wiring logic units connecting the FFs to the combinational logic circuits is reduced, and wiring logic units between combinational logics can be removed.

A truth table data set is generated from scannable FFs identified by extraction processing (S302). The scan FFs 1100 are extracted. A plurality of MLUTs are necessary between the FFs on which logic synthesis has been performed, and thus, truth table data that expresses this combinational logic is generated. Naturally, FFs include wiring logic units, and thus, the generated truth table data includes truth table data in which the logic state between FFs is expressed by wiring logic. The plurality of generated truth table data for writing to the plurality of MLUTs express the connective state between FFs, and thus, wiring logic between the glue logic and FFs shown in FIG. 27 is not generated.

Next, the FFs are arranged (S303). In this step, a process of allocating truth table data for FFs to synchronously selected MLUTs is performed. This process is also a process of allocating truth table to simulated MLUTs. In the MLUT simulation, if truth table for circuit description is written to MLUTs, then at least the timing analysis measuring the operation speed is performed. Thus, in the simulation environment, the wiring length corresponding to the number of MLUTs realized in the desired circuit description is calculated, the signal delay due to the wiring length is calculated, and the timing analysis such as clock synchronization is performed.

Then, glue logic arrangement is performed (S304). In this step, a process of allocating truth table data for glue logic to asynchronously selected MLUTs is performed. This process is also a process of allocating truth table to simulated MLUTs.

In S304, MLUT slicing or coupling described with reference to FIGS. 12 to 14 may be performed as necessary. MLUT slicing or coupling means forming a netlist appropriate for MLUTs. The slicing step is to make the number of input units and output units of a logic circuit less than or equal to a prescribed number of AD pairs such that a prescribed logic circuit can be covered by one truth table allocated to one MLUT. For coupling, two or more truth tables that can be contained in one MLUT are consolidated to one truth table in order to optimize the number of truth tables configured in the MLUTs. By such MLUT slicing or coupling, it is possible to optimize the number of truth table configured in the MLUT.

Next, the MLUTs to which truth table data are allocated are evaluated to determine whether or not the MLUTs satisfy conditions such as a prescribed number of MLUTs or operation speed (S305). If, based on the evaluation, the conditions are satisfied ("Yes" in S305), then a process is performed in which actual truth table data is generated and stored in the memory unit 214 and/or written to the MRLD through the output unit 213. At this time, the generated truth table includes a first truth table data set for writing to a first set among the plurality of MLUTs from a sequential logic data set (that is, the scan FFs) to be scanned according to extraction performed in step S302, and a second truth table data set for writing to a second set among the plurality of MLUTs from a combinational logic circuit data set of the netlist. If the condition is not satisfied ("No" in S305), then the process returns to S303, and the process of returning the FFs and glue logic to the MLUTs again is repeated.

(5) Logic or Connective Operation on MLUT

The logic or connective operation of the MRLD will be described below. A multidirectional MLUT will be used as an example in the description.

A. Logic Element

FIG. 30 shows an example of an MLUT operating as a logic element. In FIG. 30, in order to simplify description, the address selector, the data selector, and the I/O buffer are omitted. The MLUTs 30a and 30b shown in FIG. 30 each have four logic address input LA lines A0 to A3, four logic operation data lines D0 to D3, 4×16=64 memory elements 40, and an address decoder 9. The logic operation data lines D0 to D3 are connected in series respectively to 24 of the memory elements 40. The address decoder 9 is configured to select four memory elements connected to any of the 16 word lines on the basis of signals inputted to the logic address input LA lines A0 to A3. The four memory elements are respectively connected to the logic operation data lines D0 to D3, and data stored in the memory elements is outputted to the logic operation data lines D0 to D3. A configuration can be adopted whereby if, for example, an appropriate signal is inputted to the logic address input LA lines A0 to A3, then the four memory elements 40a, 40b, 40c, and 40d are selected. The memory element 40a is connected to the logic operation data line D0, the memory element 40b is connected to the logic operation data line D1, the memory element 40c is connected to the logic operation data line D2, and the memory element 40d is connected to the logic operation data line D3. Signals to be stored in the memory elements 40a to 40d are outputted to the logic operation data lines D0 to D3. In this manner, the MLUTs 30a and 30b receive logic address input LAs from the logic address input LA lines A0 to A3, and the values stored in the four memory elements 40 selected by the address decoder 9 as a result of the logic address input LAs are outputted as logic operation data to the logic operation data lines D0 to D3. The logic address input LA line A2 of the MLUT 30a is connected to the logic operation data line D0 of the adjacent MLUT 30b, and the MLUT 30a receives the logic operation data outputted from the MLUT 30b as the logic address input LA. The logic operation data line D2 of the MLUT 30a is connected to the logic address input LA line A0 of the MLUT 30b, and the MLUT 30b receives the logic operation data outputted from the MLUT 30a as the logic address input LA. The logic operation data line D2 of the MLUT 30a outputs to the logic address input LA line A0 of the MLUT 30b a signal stored in any of the 16 memory elements connected to the logic operation data line D2 on the basis of the signal inputted to the logic address input LA lines A0 to A3 of the MLUT 30a. Similarly, the logic operation data line D0 of the MLUT 30b outputs to the logic address input LA line A2 of the MLUT 30a a signal stored in any of the 16 memory elements connected to the logic operation data line D0 on the basis of the signal inputted to the logic address input LA lines A0 to A3 of the MLUT 30b. In this manner, the connection between MRLDs is achieved by a pair including an address line and a data line.

In FIG. 30, there are four AD pairs in the MLUTs 30a and 30b, but the number of AD pairs is not limited to four as will be described later.

FIG. 31 shows an example of an MLUT operating as a logic circuit. In the present example, the logic address input LA lines A0 and A1 are the inputs for a two-input NOR circuit 701, and the logic address input LA lines A2 and A3 are inputs for a two-input NAND circuit 702. A logic circuit is configured in which the output from the two-input NOR circuit 701 and the output from the two-input NAND circuit are inputted to a two-input NAND circuit 703, and the output of the two-input NAND circuit 703 is outputted to the logic operation data line D0.

FIG. 32 shows a truth table of the logic circuit shown in FIG. 31. The logic circuit of FIG. 31 has four inputs, and thus, the inputs of all of the input ends A0 to A3 are treated as inputs of the logic circuit. On the other hand, there is only one output, and thus, only the output end D0 is treated as the output of the logic circuit. The columns in the truth table under the outputs D1 to D3 have "*" under them. This indicates that "0" and "1" are both acceptable values. However, when actually writing truth table data to the MLUT for reconfiguration, a value of "0" or "1" must be written in these columns. At least data unneeded in the relation between the memory cell unit 31A and the memory cell unit 31B shown in FIG. 4 is set as 0.

B. Connective Element

FIG. 33 shows an example of an MLUT operating as a connective element. In FIG. 33, the MLUT functioning as a connective element operates so as to output the signal from the logic address input LA line A0 to the logic operation data line D1, output the signal from the logic address input LA line A1 to the logic operation data line D2, and output the signal from the logic address input LA line A2 to the logic operation data line D3. The MLUT functioning as the connective element further operates to output the signal from the logic address input LA line A3 to the logic operation data line D0.

FIG. 34 shows a truth table of the connective element shown in FIG. 33. The connective element shown in FIG. 33 has four input ends and four output ends. Thus, all input ends A0 to A3 and all output ends D0 to D3 are used. The MLUT operates as a connective element so as to output the signal of the input end A0 to the output end D1, output the signal of the input end A1 to the output end D2, output the signal of the input end A2 to the output end D3, and output the signal of the input end A3 to the output end D0, according to the truth table shown in FIG. 34.

FIG. 35 shows an example of a connective element realized by an MLUT having four AD pairs including an AD pair 0, an AD pair 1, an AD pair 2, and an AD pair 3. The AD pair 0 has the logic address input LA line A0 and the logic operation data line D0. The AD pair 1 has the logic address input LA line A1 and the logic operation data line D1. The AD pair 2 has the logic address input LA line A2 and the logic operation data line D2. The AD pair 3 has the logic address input LA line A3 and the logic operation data line D3. In FIG. 35, the two-dot chain line shows the path of the signal inputted to the logic address input LA line A0 of the AD pair 0 being outputted to the logic operation data line D1 of the AD pair 1. The broken line shows the path of the signal inputted to the logic address input LA line A1 of the second AD pair 1 being outputted to the logic operation data line D2 of the AD pair 2. The solid line shows the path of the signal inputted to the logic address input LA line A2 of the AD pair 2 being outputted to the logic operation data line D3 of the AD pair 3. The one-dot chain line shows the path of the signal inputted to the logic address input LA line A3 of the AD pair 3 being outputted to the logic operation data line D0 of the AD pair 0.

In FIG. 35, there are four AD pairs in the MLUT 30, but the number of AD pairs is not limited to four.

C. Function Combining Logic Element and Connective Element

FIG. 36 shows an example of one MLUT operating as a logic element and a connective element. In the example shown in FIG. 36, a logic circuit is configured in which the logic address input LA lines A0 and A1 function as the inputs for a two-input NOR circuit 171, the output from the two-input NOR circuit 171 and the logic address input LA line A2 function as inputs for a two-input NAND circuit 172, and the output from the two-input NAND circuit 172 is outputted to the logic operation data line D0. At the same time, a connective element outputting the signal from the logic address input LA line A3 to the logic operation data line D2 is configured.

FIG. 37 shows a truth table of the logic element and the connective element shown in FIG. 36. The logic operation in FIG. 36 uses three input ends A0 to A2 and one output end D0. On the other hand, the connective element of FIG. 37 is configured such that the signal from the input end A3 is outputted to the output end D2.

FIG. 38 shows an example of a logic element and a connective element realized by an MLUT having four AD pairs including an AD pair 0, an AD pair 1, an AD pair 2, and an AD pair 3. In a manner similar to the MLUT shown in FIG. 35, the AD pair 0 has the logic address input LA line A0 and the logic operation data line D0. The AD pair 1 has the logic address input LA line A1 and the logic operation data line D1. The AD pair 2 has the logic address input LA line A2 and the logic operation data line D2. The AD pair 3 has the logic address input LA line A3 and the logic operation data line D3. As described above, a single MLUT 30 realizes two operations: the logic element having three input ends and one output end, and the connective element having one input end and one output end. Specifically, the logic element uses the logic address input LA line A0 of the AD pair 0, the logic address input LA line A1 of the AD pair 1, and the logic address input LA line A2 of the AD pair 2 as inputs. The logic element uses the address line of the logic operation data line D0 of the AD pair 0 as the output. In the connective element, as shown with the broken line, the signal inputted to the logic address input LA line A2 of the AD pair 2 is outputted to the logic operation data line D1 of the AD pair 1.

The embodiment described above is merely a typical example, and it is apparent those skilled in the art that combinations, modifications, and variations of the components of the respective embodiments can be made. Thus, it is apparent to those skilled in the art that various modifications can be made to the embodiments above without deviating from the gist of the present invention or from the scope of the invention defined by the claims. In particular, during logic or connective operation of the MRLD, having a bidirectional MLUT operate as a multidirectional MLUT can be accomplished by modifying an embodiment.

DESCRIPTION OF REFERENCE CHARACTERS

20 MRLD
30 MLUT
60 logic unit array
100 reconfigurable semiconductor device

What is claimed is:

1. A logic configuration method for a reconfigurable semiconductor device having a plurality of memory units each including a plurality of memory cells that store data,
    wherein the memory units are configured to operate as logic circuits by storing, in the memory cells therein, truth table data that outputs logic values in response to address input,
    wherein the memory units each have at least 2×n input lines and output lines forming pairs, n being an integer of greater than or equal to 2,
    wherein the memory units are connected to each other by 2×n output lines from one memory unit being connected to an n number of input lines of two other memory units, and
    wherein the logic configuration method comprises:
        generating a netlist having circuit connective information on the basis of a circuit description that describes a circuit configuration to be implemented in the reconfigurable semiconductor device;
        extracting a logic cone that includes sequential logics from the netlist;
        determining the number of stages of memory units that are to be used to constitute the extracted logic cone on a basis of a quotient obtained by dividing a number of input lines to the extracted logic cone by n/2; and
        generating the truth table data for the memory units that constitute the extracted logic cone.

2. The logic configuration method according to claim 1, wherein the step of generating the netlist includes typecasting variable bits in a program coded in a high level language to a smaller bit size.

3. The logic configuration method according to claim 1, wherein the memory units are each connected to other memory units on one side and another side opposite to the one side, and have a plurality of memory cell units,
    wherein at least one of the plurality of memory cell units has a plurality of memory cells, and the memory cells store first truth table data for outputting a logic value from the one side and second truth table data for outputting a logic value from said another side in response to address input from the one side, and
    wherein the step of generating the truth table data includes generating the first truth table data and the second truth table data.

4. The logic configuration method according to claim 1, wherein the step of generating the netlist includes at least one of loop unrolling and parallelization in a program coded in a high level language.

5. The logic configuration method according to claim 1, further comprising:

extracting a scannable sequential logic data set from the netlist and generating a scanned sequential logic data set;

generating a first truth table data for writing to a first set among the plurality of memory cell units from the scanned sequential logic data set; and generating a second truth table data for writing to a second set among the plurality of memory cell units from a combinational logic circuit data set of the netlist.

6. The logic configuration method according to claim 1, wherein the semiconductor device has, in addition to the memory units, a plurality of logic units each having a sequential logic element, and wherein the logic configuration method further comprises:

generating the netlist describing logic circuit data, sequential logic data, and connective information of the logic circuit data and the sequential logic data from the circuit description describing the circuit configuration; and allocating the logic circuit data and the sequential logic data respectively to the memory cells and the logic circuit elements from the generated netlist according to the connective information.

7. The logic configuration method according to claim 6, wherein the semiconductor device has switching elements on outer portions of the logic units, and wherein the logic configuration method further comprises: allocating connective information of the netlist to the switching elements.

8. The logic configuration method according to claim 6, wherein the memory cells of the memory units operate as connective elements when truth table data, configured to output to the memory units of other logic units an input value identified by an address, is written, and wherein the logic configuration method further comprises: allocating connective information of the netlist to the memory units.

9. The logic configuration method according to claim 6, wherein the sequential logic data is removed after generating the netlist, and wherein the logic circuit data is allocated to the memory cells, and then the sequential logic data is allocated to the logic circuit elements from the generated netlist in accordance with the connective information.

10. The logic configuration method according to claim 6, wherein the step of generating the netlist includes generating logic circuit data, sequential logic data, and a parallel-in/serial-out shift register including the logic circuit data.

11. The logic configuration method according to claim 6, wherein the sequential logic elements store data read from the memory units and are sequential logics that output the stored data in synchronization with a clock signal.

12. A logic configuration device that performs logic configuration for a semiconductor device having a plurality of memory units each including a plurality of memory cells that store data, wherein the semiconductor device is configured such that the memory units operate as logic circuits by storing, in the memory cells therein, truth table data that outputs logic values in response to address input, wherein the memory units each have at least 2×n input lines and output lines forming pairs, n being an integer of greater than or equal to 2, wherein the memory units are connected to each other by 2×n output lines from one memory unit being connected to an n number of input lines of two other memory units, wherein the logic configuration device comprises a processor, and wherein the processor is configured so as to generate a netlist having circuit connective information on the basis of a circuit description that describes a circuit configuration to be implemented in the semiconductor device;

extract a logic cone that includes sequential logics from the netlist;

determine the number of stages of memory units that are to be used to constitute the extracted logic cone on a basis of a quotient obtained by diving a number of input lines to the extracted logic cone by n/2; and generate the truth table data for the memory units that constitute the extracted logic cone.

13. The logic configuration device according to claim 12, wherein generation of the netlist includes typecasting variable bits in a program coded in a high level language to a smaller bit size.

14. The logic configuration device according to claim 12, wherein the memory units are each connected to other memory units on one side and another side opposite to the one side, and have a plurality of memory cell units, wherein at least one of the plurality of memory cell units has a plurality of memory cells, and the memory cells store first truth table data for outputting a logic value from the one side and second truth table data for outputting a logic value from said another side in response to address input from the one side, and wherein the generation of the truth table data includes generating the first truth table data and the second truth table data.

15. The logic configuration device according to claim 12, wherein the generation of the netlist includes at least one of loop unrolling and parallelization in a program coded in a high level language.

16. The logic configuration device according to claim 12, wherein the processor is configured so as to extract a scannable sequential logic data set from the netlist and generate a scanned sequential logic data set;

generate a first truth table data set for writing to a first set among the plurality of memory cell units from the scanned sequential logic data set; and generate a second truth table data set for writing to a second set among the plurality of memory cell units from a combinational logic circuit data set of the netlist.

17. The logic configuration device according to claim 12, wherein the semiconductor device has, in addition to the memory units, a plurality of logic units having sequential logic elements, wherein the processor generates the netlist describing logic circuit data, sequential logic data, and connective information of the logic circuit data and the sequential logic data from the circuit description describing the circuit configuration; and allocates the logic circuit data and the sequential logic data respectively to the memory cells and the logic circuit elements from the generated netlist according to the connective information.

18. The logic configuration device according to claim 17, wherein the semiconductor device has switching elements on outer portions of the logic units, and
wherein the logic configuration device further comprises: allocating connective information of the netlist to the switching elements.

19. The logic configuration device according to claim 17, wherein the memory cells of the memory units operate as connective elements when truth table data, configured to output to the memory units of other logic units an input value identified by an address, is written, and
wherein the processor is configured so as to allocate connective information of the netlist to the memory units.

20. The logic configuration device according to claim 17, wherein the processor is configured so as to
remove the sequential logic data after generating the netlist, and
allocate the logic circuit data to the memory cells, and then allocate the sequential logic data to the logic circuit elements from the generated netlist in accordance with the connective information.

21. The logic configuration device according to claim 17, wherein generating the netlist includes generating logic circuit data, sequential logic data, and a parallel-in/serial-out shift register including the logic circuit data.

22. The logic configuration device according to claim 17, wherein the sequential logic elements store data read from the memory units and are sequential logics that output the stored data in synchronization with a clock signal.

23. A non-transitory storage medium that stores a program executable by a processor, the program being for performing logic configuration for a semiconductor device having a plurality of memory units each including a plurality of memory cells that store data,
wherein the semiconductor device is configured such that the memory units operate as logic circuits by storing, in the memory cells therein, truth table data that outputs logic values in response to address input,
wherein the memory units each have at least 2×n input lines and output lines forming pairs, n being an integer of greater than or equal to 2,
wherein the memory units are connected to each other by 2×n output lines from one memory unit being connected to an n number of input lines of two other memory units, and
wherein said program causes the processor to perform the following:
generating a netlist having circuit connective information on the basis of a circuit description that describes a circuit configuration to be implemented in the reconfigurable semiconductor device;
extracting a logic cone that includes sequential logics from the netlist;
determining the number of stages of memory units that are to be used to constitute the extracted logic cone on a basis of a quotient obtained by dividing a number of input lines to the extracted logic cone by n/2; and
generating the truth table data for the memory units that constitute the extracted logic cone.

24. The non-transitory storage medium according to claim 23, wherein generation of the netlist includes typecasting variable bits in a program coded in a high level language to a smaller bit size.

25. The non-transitory storage medium according to claim 23,
wherein the memory units are each connected to other memory units on one side and another side opposite to the one side, and have a plurality of memory cell units,
wherein at least one of the plurality of memory cell units has a plurality of memory cells, and the memory cells store first truth table data for outputting a logic value from the one side and second truth table data for outputting a logic value from said another side in response to address input from the one side, and
wherein the process of generating the truth table data includes a process of generating the first truth table data and the second truth table data.

26. The non-transitory storage medium according to claim 23, wherein the generation of the netlist includes at least one of loop unrolling and parallelization in a program coded in a high level language.

27. The non-transitory storage medium according to claim 23,
wherein said program causes the processor to perform the following:
extracting a scannable sequential logic data set from the netlist and generating a scanned sequential logic data set;
generating a first truth table data set for writing to a first set among the plurality of memory cell units from the scanned sequential logic data set; and
generating a second truth table data set for writing to a second set among the plurality of memory cell units from a combinational logic circuit data set of the netlist.

28. The non-transitory storage medium according to claim 23,
wherein the semiconductor device has, in addition to the memory units, a plurality of logic units having sequential logic elements,
wherein said program causes the processor to perform the following:
generating the netlist describing logic circuit data, sequential logic data, and connective information of the logic circuit data and the sequential logic data from the circuit description describing the circuit configuration; and
allocating the logic circuit data and the sequential logic data respectively to the memory cells and the logic circuit elements from the generated netlist in accordance with the connective information.

29. The non-transitory storage medium according to claim 28,
wherein the semiconductor device has switching elements on outer portions of the logic units, and
wherein said program causes the processor to execute a process of allocating connective information of the netlist to the switching elements.

30. The non-transitory storage medium according to claim 28,
wherein the memory cells of the memory units operate as connective elements when truth table data, configured to output to the memory units of other logic units an input value identified by an address, is written, and
wherein the processor executes a process of allocating connective information of the netlist to the memory units.

31. The non-transitory storage medium according to claim 28,
wherein said program causes the processor to perform the following:
removing the sequential logic data after generating the netlist, and
allocating the logic circuit data to the memory cells, and then allocating the sequential logic data to the logic circuit elements from the generated netlist in accordance with the connective information.

32. The non-transitory storage medium according to claim 28, wherein generation of the netlist includes a process of generating logic circuit data, sequential logic data, and a parallel-in/serial-out shift register including the logic circuit data.

33. The non-transitory storage medium according to claim 23, wherein the sequential logic elements store data read from the memory units and are sequential logics that output the stored data in synchronization with a clock signal.

* * * * *